(12) United States Patent
Okada et al.

(10) Patent No.: US 8,054,067 B2
(45) Date of Patent: Nov. 8, 2011

(54) MAGNETIC SENSOR AND ROTATION-ANGLE-DETECTING APPARATUS WITH A BRIDGE CIRCUIT

(75) Inventors: Yasuyuki Okada, Kumagaya (JP); Chiharu Mitsumata, Kumagaya (JP)

(73) Assignee: Hitachi Metals Ltd., Tokyo (JP)

( * ) Notice: Subject to any disclaimer, the term of this patent is extended or adjusted under 35 U.S.C. 154(b) by 447 days.

(21) Appl. No.: 12/359,684

(22) Filed: Jan. 26, 2009

(65) Prior Publication Data

US 2009/0189601 A1 Jul. 30, 2009

(30) Foreign Application Priority Data

Jan. 29, 2008 (JP) ................................. 2008-018031
Jun. 24, 2008 (JP) ................................. 2008-164644
Sep. 18, 2008 (JP) ................................. 2008-238938

(51) Int. Cl.
*G01B 7/30* (2006.01)
(52) U.S. Cl. ............... 324/207.21; 324/207.25; 324/252
(58) Field of Classification Search ............ 324/207.21, 324/207.25, 252
See application file for complete search history.

(56) References Cited

U.S. PATENT DOCUMENTS

| 6,175,296 B1 * | 1/2001 | Tokunaga et al. ........... 338/32 R |
| 6,501,678 B1 | 12/2002 | Lenssen et al. |
| 7,265,540 B2 | 9/2007 | Sudo et al. |
| 2009/0027048 A1 * | 1/2009 | Sato et al. ..................... 324/247 |
| 2009/0315543 A1 * | 12/2009 | Guo et al. ................ 324/207.21 |

FOREIGN PATENT DOCUMENTS

| JP | 2001-159542 A | 6/2001 |
| JP | 2003-502876 A | 1/2003 |
| JP | 3587678 B2 | 8/2004 |
| JP | 2005-024287 A | 1/2005 |

* cited by examiner

*Primary Examiner* — Jay Patidar
(74) *Attorney, Agent, or Firm* — Sughrue Mion, PLLC

(57) ABSTRACT

A magnetic sensor comprising a bridge circuit in which four magnetoresistive devices are connected, the magnetoresistive device comprising a spin-valve, giant-magnetoresistive film comprising a pinned layer having unidirectional magnetic anisotropy, a free layer whose magnetization direction is rotated in alignment with an external magnetic field direction, and an intermediate layer sandwiched by the pinned layer and the free layer, and at least one of the magnetoresistive devices meeting the condition of $36° \leq \theta < 45°$, wherein $\theta$ is an acute angle between its longitudinal direction and the magnetization direction of the pinned layer.

14 Claims, 26 Drawing Sheets

Device Pattern: Straight

Device Pattern: Circle

Device Pattern: Notched Circle

Device Pattern: Semi-circle

Device Pattern: Semi-circle

Device Pattern: Notched Hexagon

Device Arrangement: Parallel

Bridge X

Bridge Y

Device Arrangement: Non-parallel

MAGNETIC SENSOR AND ROTATION-ANGLE-DETECTING APPARATUS WITH A BRIDGE CIRCUIT

CROSS-REFERENCE TO RELATED APPLICATION

This application relates to and claims the benefit of priority from Japanese Patent Application Nos.: 2008-018031, filed Jan. 29, 2008, 2008-164644, filed Jun. 24, 2008, and 2008-238938, filed Sep. 18, 2008, the entire disclosures of which are hereby incorporated by reference.

FIELD OF THE INVENTION

The present invention relates to a magnetic sensor comprising magnetoresistive devices each formed by a spin-valve, giant-magnetoresistive film, and a rotation-angle-detecting apparatus.

BACKGROUND OF THE INVENTION

Magnetic sensors using magnetoresistive devices capable of detecting the change of a rotation angle, etc. without contact are required to have good detection sensitivity to a rotating magnetic field. Used for high-sensitivity magnetoresistive devices is a spin-valve, giant-magnetoresistive (SVGMR) film comprising a pinned layer having magnetization anisotropy (simply called "pinned layer"), a non-magnetic intermediate layer formed on the pinned layer for cutting magnetic coupling, and a free layer formed on the non-magnetic intermediate layer and having a magnetization direction rotatable to an arbitrary direction by an external magnetic field. A Wheatstone bridge comprising devices each having the SVGMR film provides a magnetic sensor whose output voltage changes depending on the direction of an external magnetic field.

In a rotation angle sensor constituted by pluralities of SVGMR devices, the unevenness of the SVGMR device in magnetic properties such as an interlayer-coupling magnetic field $H_{int}$, an anisotropic magnetic field $H_k$, etc. increases an angle error (error of a rotation angle output from the rotation angle sensor). JP 2001-159542 A discloses a rotation angle sensor in which four devices cut out of the same wafer are connected to constitute a bridge. However, this rotation angle sensor fails to absorb unevenness in a wafer plane. The SVGMR device is sometimes referred to simply as "device."

JP 2003-502876 A discloses a method for forming a device having pluralities of magnetic-sensing directions on the same wafer. In this method, after a desired pattern is formed, an external magnetic field is applied to the device while locally heating it by a heater, such that a pinned layer is magnetized in a desired direction. FIGS. 37 and 38 show the arrangement of devices obtained by this method. As shown in FIG. 38 with enlargement, there are devices whose pinned layers have antiparallel magnetization directions in an arrow direction 100, but there are no devices whose pinned layers have antiparallel magnetization directions in an arrow direction 100' perpendicular to the arrow direction 100. Therefore, a bridge circuit with such device arrangement provides only an output having the same phase, failing to obtain a full-bridge output. Also, a device arrangement having an angle of 90° between devices cannot provide output signals with small angle error and distortion.

To suppress power consumption and heat generation to proper levels, the devices are preferably elongated to have higher resistance. However, the device with such a shape has non-negligible shape-induced anisotropy, exerting a large anisotropic magnetoresistance (AMR) effect generated from a free layer in the SVGMR film, resulting in increased angle error. JP 2005-024287 A proposes the connection of devices in a pattern in which their longitudinal directions are perpendicular to each other to cancel the AMR effect. Japanese Patent 3587678 proposes a semi-circular or spiral device pattern with reduced $H_k$. However, these structures only cancel the AMR effect or reduce $H_k$, but they fail to eliminate the unevenness of GMR characteristics to reduce angle error.

OBJECT OF THE INVENTION

Accordingly, an object of the present invention is to provide a magnetic sensor with reduced angle error that is generated by the production variation of SVGMR films, and a rotation-angle-detecting apparatus comprising such a magnetic sensor.

DISCLOSURE OF THE INVENTION

The magnetic sensor of the present invention comprises a bridge circuit in which four magnetoresistive devices are connected, the magnetoresistive device comprising a spin-valve, giant-magnetoresistive film comprising a pinned layer having unidirectional magnetic anisotropy, a free layer whose magnetization direction is rotated in alignment with an external magnetic field direction, and an intermediate layer sandwiched by the pinned layer and the free layer, and at least one of the magnetoresistive devices meeting the condition of $36° \leq \theta < 45°$, wherein $\theta$ is an acute angle between its longitudinal direction and the magnetization direction of the pinned layer.

The magnetic sensor of the present invention preferably comprises a combination of the above two bridge circuits, in which a longitudinal direction of a magnetoresistive device in one bridge circuit is perpendicular to a longitudinal direction of a magnetoresistive device in the other bridge circuit.

Among four magnetoresistive devices, two magnetoresistive devices are preferably inclined by the acute angle $\theta$, with the remaining two magnetoresistive devices inclined by an acute angle $-\theta$, from the magnetization direction of the pinned layer.

In one embodiment of the present invention, two magnetoresistive devices constituting each half-bridge comprise pinned layers having antiparallel magnetization directions, one device being inclined by an angle $\theta$, with the other device inclined by an angle $-\theta$, from the magnetization direction of the pinned layer in each half-bridge. Namely, magnetoresistive devices whose pinned layers have the same magnetization direction are parallel.

In another embodiment of the present invention, two magnetoresistive devices constituting half-bridges comprise pinned layers having antiparallel magnetization directions, both magnetoresistive devices in one half-bridge being inclined by an angle $\theta$, with both magnetoresistive devices in the other half-bridge inclined by an angle $-\theta$, from the magnetization direction of the pinned layer. Namely, magnetoresistive devices whose pinned layers have the same magnetization direction are not parallel. Such arrangement cancels a shape-induced anisotropy, resulting in suppressed influence on an angle error.

The magnetoresistive device preferably has (a) a shape of a folded straight line, (b) a shape comprising pluralities of semi-circles connected and longitudinally folded, or (c) a shape comprising pluralities of partially notched circles or polygons connected and longitudinally folded An exchange-coupling field $H_{int}$ between the pinned layer and the free layer in the spin-valve, giant-magnetoresistive film preferably meets the condition of $-0.4$ kA/m$\leq H_{int} \leq +0.4$ kA/m.

The first magnetic sensor of the present invention comprises a bridge X comprising first to fourth magnetoresistive devices and a bridge Y comprising fifth to eighth magnetoresistive devices, the magnetoresistive device comprising a spin-valve, giant-magnetoresistive film comprising a pinned layer having unidirectional magnetic anisotropy, a free layer whose magnetization direction is rotated in alignment with an external magnetic field direction, and an intermediate layer sandwiched by the pinned layer and the free layer, an angle between the longitudinal direction of each device and the magnetization direction of the pinned layer meeting the following conditions:

the angle of the first device=the angle of the third device,
the angle of the second device=the angle of the fourth device,
the angle of the first device=−the angle of the second device,
the angle of the fifth device=the angle of the seventh device,
the angle of the sixth device=the angle of the eighth device,
the angle of the fifth device=−the angle of the sixth device, and
at least one of the magnetoresistive devices meeting the condition of $37° \leq \theta \leq 44°$, wherein $\theta$ is an acute angle between its longitudinal direction and the magnetization direction of the pinned layer.

The second magnetic sensor of the present invention comprises a bridge X comprising first to fourth magnetoresistive devices and a bridge Y comprising fifth to eighth magnetoresistive devices, the magnetoresistive device comprising a spin-valve, giant-magnetoresistive film comprising a pinned layer having unidirectional magnetic anisotropy, a free layer whose magnetization direction is rotated in alignment with an external magnetic field direction, and an intermediate layer sandwiched by the pinned layer and the free layer, an angle between the longitudinal direction of each device and the magnetization direction of the pinned layer meeting the following conditions:

the angle of the first device=the angle of the fourth device,
the angle of the second device=the angle of the third device,
the angle of the first device=−the angle of the second device,
the angle of the fifth device=the angle of the eighth device,
the angle of the sixth device=the angle of the seventh device,
the angle of the fifth device=−the angle of the sixth device, and
at least one of the magnetoresistive devices meeting the condition of $39° \leq \theta \leq 44°$, wherein $\theta$ is an acute angle between its longitudinal direction and the magnetization direction of the pinned layer.

In the first and second magnetic sensors, the longitudinal direction of each device in the bridge X is preferably perpendicular to the longitudinal direction of a corresponding device in the bridge Y.

The rotation-angle-detecting apparatus of the present invention comprises the above magnetic sensor, and a magnet for applying a magnetic field to the magnetic sensor.

DESCRIPTION OF THE BEST MODE OF THE INVENTION

Figure 1:
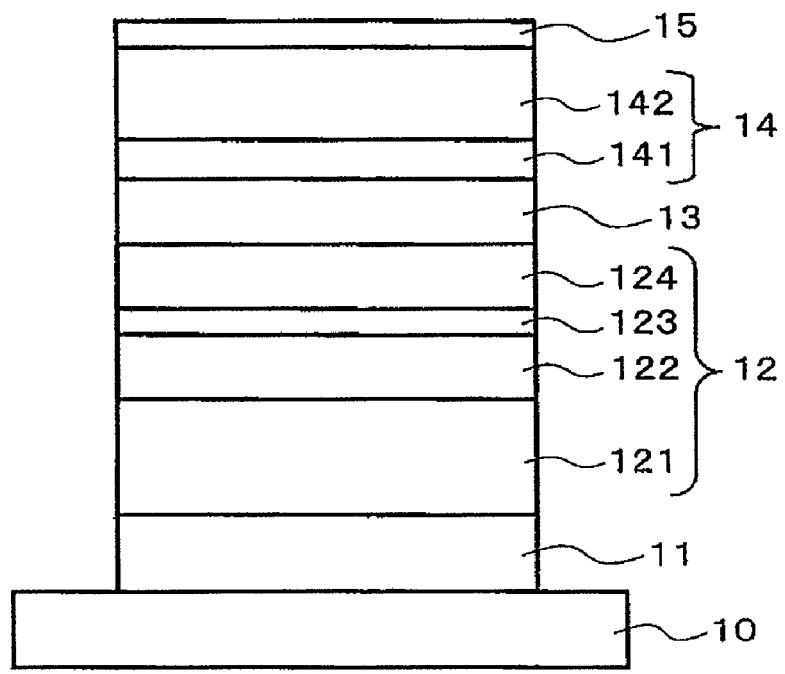
FIG. 1 is a cross-sectional view showing one example of the layer structures of a magnetoresistive film.

FIG. 1 schematically shows one example of the SVGMR films used in the present invention. In the figure, the thickness of some layers is exaggerated. This SVGMR film comprises a primer layer 11, a pinned layer 12, an intermediate layer 13, a free layer 14, and a protective layer 15 formed on a substrate 10 in this order. The pinned layer 12 is a laminate of an antiferromagnetic layer 121, a first ferromagnetic layer 122, an antiparallel-coupling layer 123 and a second ferromagnetic layer 124, and the free layer 14 is a laminate of two or more ferromagnetic layers 141, 142. The pinned layer 12 has a unidirectional magnetic anisotropy, and its electric resistance changes depending on the magnetization direction of the free layer rotating by an external magnetic field. The magnetic anisotropy direction of the pinned layer is called "magnetization direction of the pinned layer."

Figure 2:
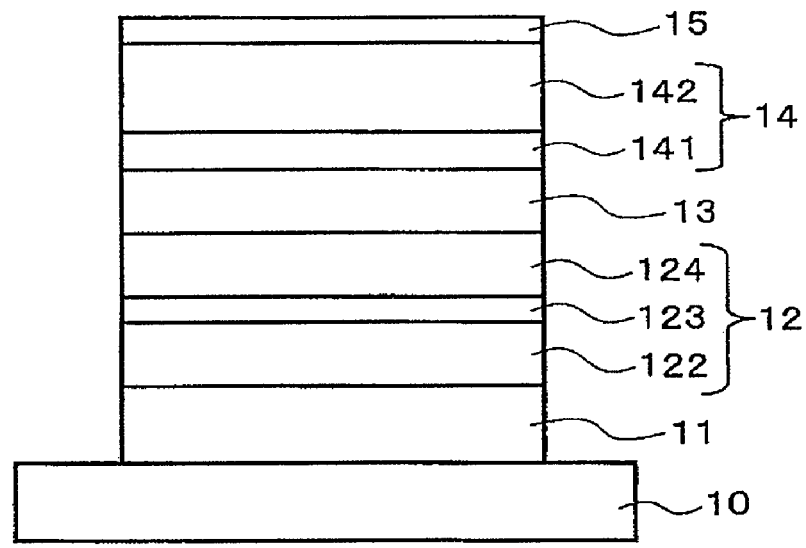
FIG. 2 is a cross-sectional view showing another example of the layer structures of a magnetoresistive film.

As shown in FIG. 2, a so-called "self-pinned" SVGMR film has a layer structure obtained by removing the antiferromagnetic layer 121 from the SVGMR film shown in FIG. 1. In the self-pinned SVGMR film, the unidirectional magnetic anisotropy of the pinned layer is generated by the interlayer exchange coupling between the ferromagnetic layers 122 and 124. The SVGMR film shown in FIG. 2 is disclosed by Japanese Patent 3033934 and JP 2004-296000 A. The SVGMR film shown in FIG. 2 does not need a heat treatment for magnetizing the pinned layer, and the anisotropy direction of the pinned layer can be arbitrarily set during the film-forming process. The magnetization direction of the pinned layer can be aligned with a magnetic field direction, for instance, by applying a magnetic field during the formation of the ferromagnetic layers 122 and 124. The lamination of four SVGMR films, whose pinned layers have different magnetization directions, via insulating layers provides a wafer with SVGMR devices having four magnetization directions of pinned layers.

Figure 3:
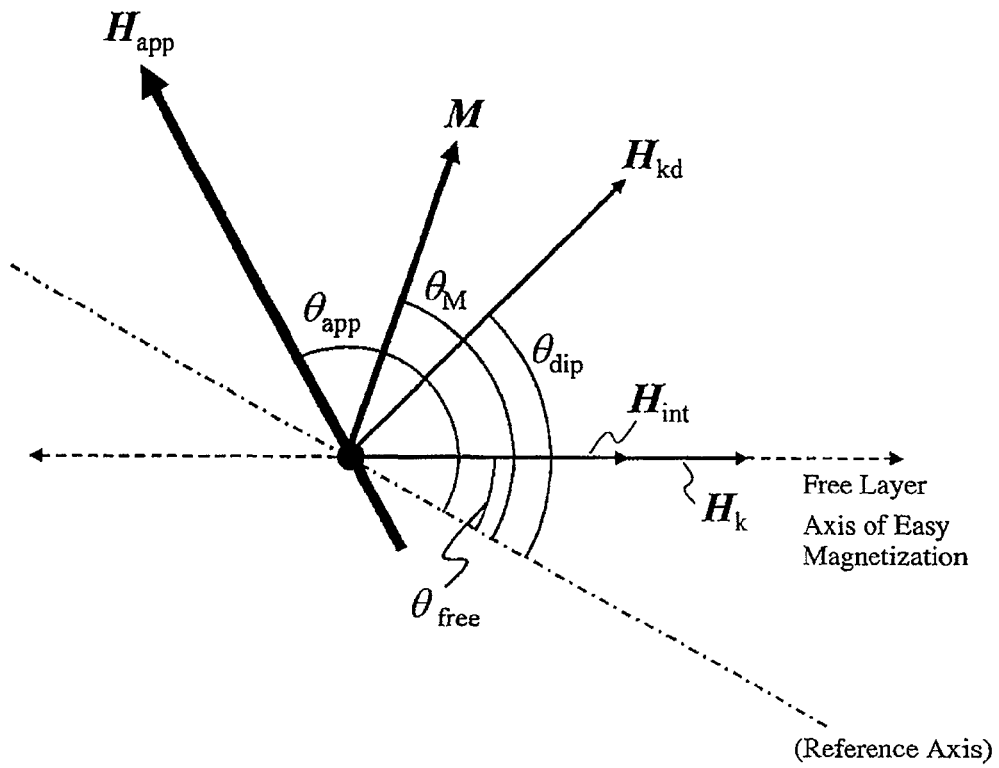
FIG. 3 is a schematic view showing magnetic energy received by a magnetoresistive device.

FIG. 3 schematically shows magnetic energy in an SVGMR device comprising SVGMR films patterned to predetermined shapes. $\theta_M$ represents the magnetization direction of the device, $\theta_{dip}$ represents a shape-induced anisotropy direction, and $\theta_{free}$ represents the direction of the free layer. Any direction is expressed by an angle from the reference axis. Because the direction $\theta_M$ of an effective magnetic field M generated by applying an external magnetic field $H_{app}$ to the device is influenced not only by the shape-induced anisotropy $H_{kd}$ of the device, but also by $H_k$, $H_{int}$, etc. variable depending on the nature of the SVGMR film, it is different from the direction $\theta_{app}$ of $H_{app}$.

The SVGMR device is subjected to a magnetic energy $E_{total}$ expressed by the following formula (1):

$$E_{total} = E_{kd} + E_k + E_{ex} + E_z \quad (1),$$

wherein $E_{kd}$ represents the shape-induced magnetic anisotropy energy of the device, $E_k$ represents the intrinsic magnetic anisotropy energy of the free layer, $E_{ex}$ represents the interlayer exchange-coupling energy of the SVGMR film, and $E_z$ represents the Zeeman energy of the SVGMR film, respectively expressed by the following formulae (2)-(5):

$$E_{kd} = K_{ud} \sin^2(\theta_M - \theta_{dip}) \quad (2),$$

$$E_k = K_u \sin^2(\theta_M - \theta_{free}) \quad (3),$$

$$E_{ex} = -H_{int} \cdot M_S \cos(\theta_M - \theta_{free}) \quad (4), \text{ and}$$

$$E_z = -H_{app} \cdot M_S \cos(\theta_{app} - \theta_M) \quad (5).$$

$M_S$ represents the magnetization of the free layer, and the magnetic anisotropy constants $K_u$ and $K_{ud}$ are expressed by the following formulae (6) and (7):

$$K_u = (H_k \cdot M_S)/2 \quad (6), \text{ and}$$

$$K_{ud} = (H_{kd} \cdot M_S)/2 \quad (7).$$

The direction $\theta_M$ of M is obtained when the $E_{total}$ is minimum. Using this $\theta_M$, the resistance R of the SVGMR device is expressed by the following formula (8):

$$R = \left\{ R_{min} + \frac{dR}{2}(1 - \cos(\theta_M - \theta_{pin})) \right\} + \{dR' \cos^2(\theta_M - \theta_{dip})\}. \quad (8)$$

A first term in the formula (8) represents resistance variation due to the GMR effect, and a second term represents resistance variation due to the AMR effect. $R_{min}$ represents the minimum resistance of the device, dR represents resistance variation due to the GMR effect, and dR' represents resistance variation due to the AMR effect.

Figure 4:
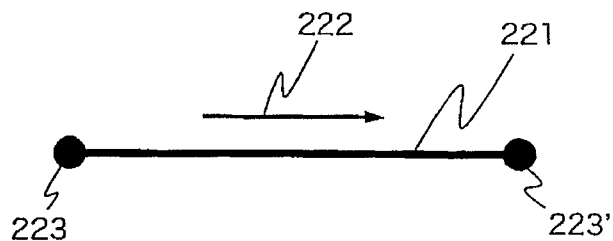
FIG. 4 is a schematic view showing magnetoresistive devices, one formed by a straight line and the other formed by a folded straight line.
Figure 4:
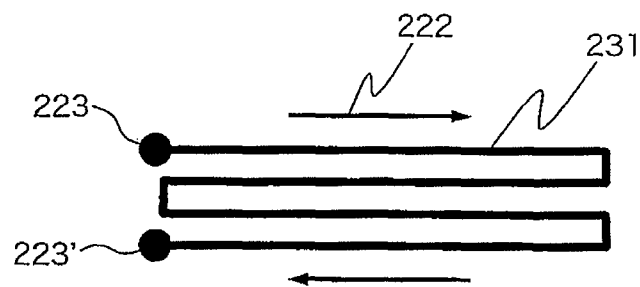
Figure 5:
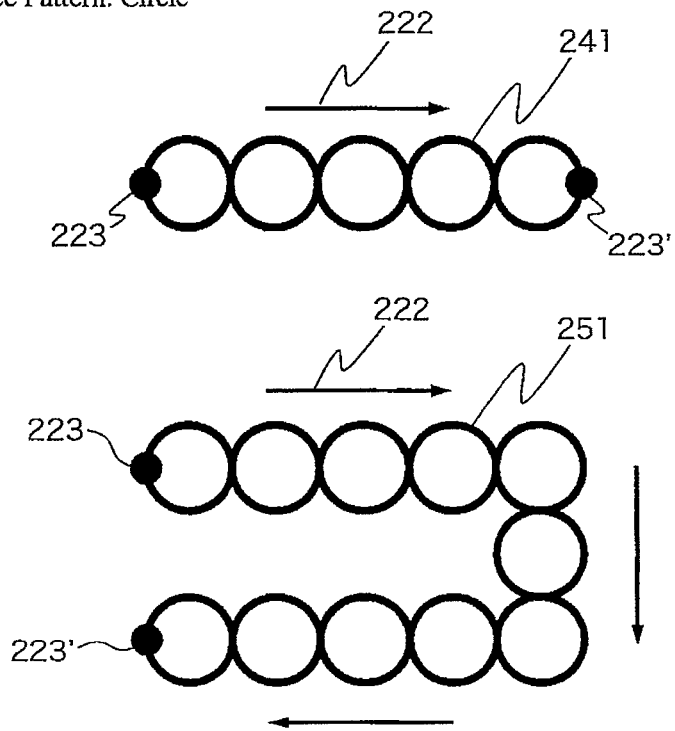
FIG. 5 is a schematic view showing magnetoresistive devices each formed by connecting pluralities of circles.
Figure 6:
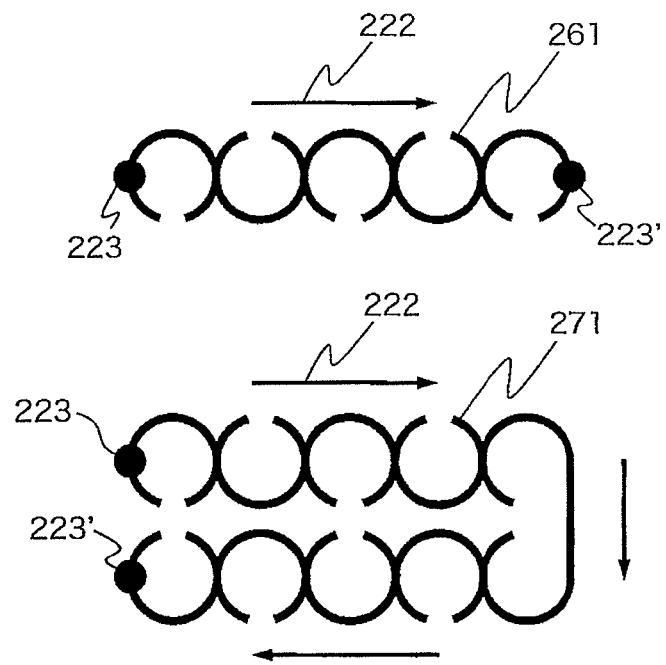
FIG. 6 is a schematic view showing magnetoresistive devices each formed by connecting pluralities of partially notched circles.
Figure 7:
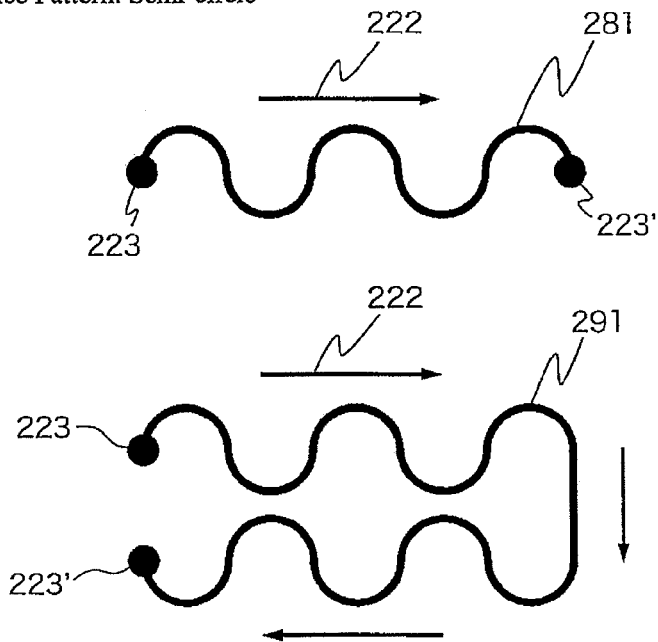
FIG. 7 is a schematic view showing one example of magnetoresistive devices each formed by connecting pluralities of semi-circles.
Figure 8:
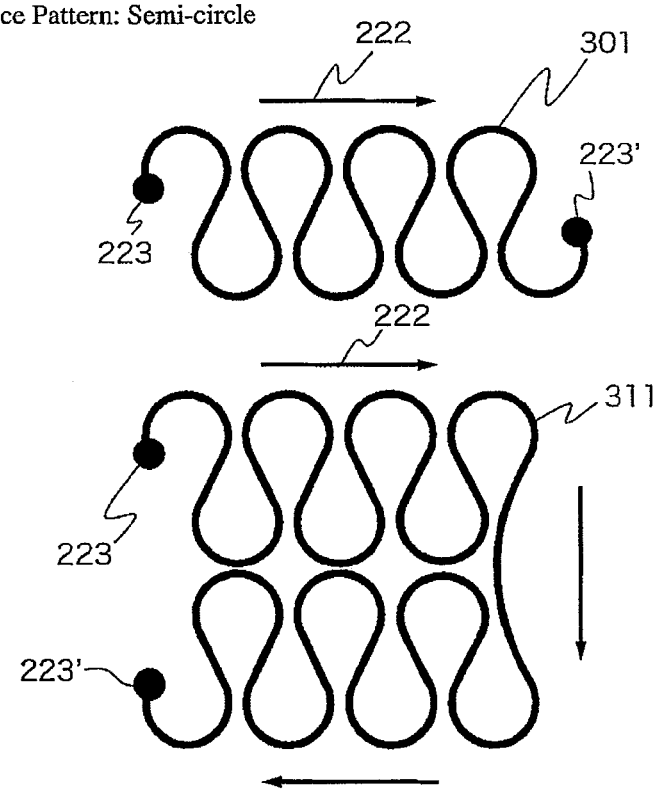
FIG. 8 is a schematic view showing another example of magnetoresistive devices each formed by connecting pluralities of semi-circles.
Figure 9:
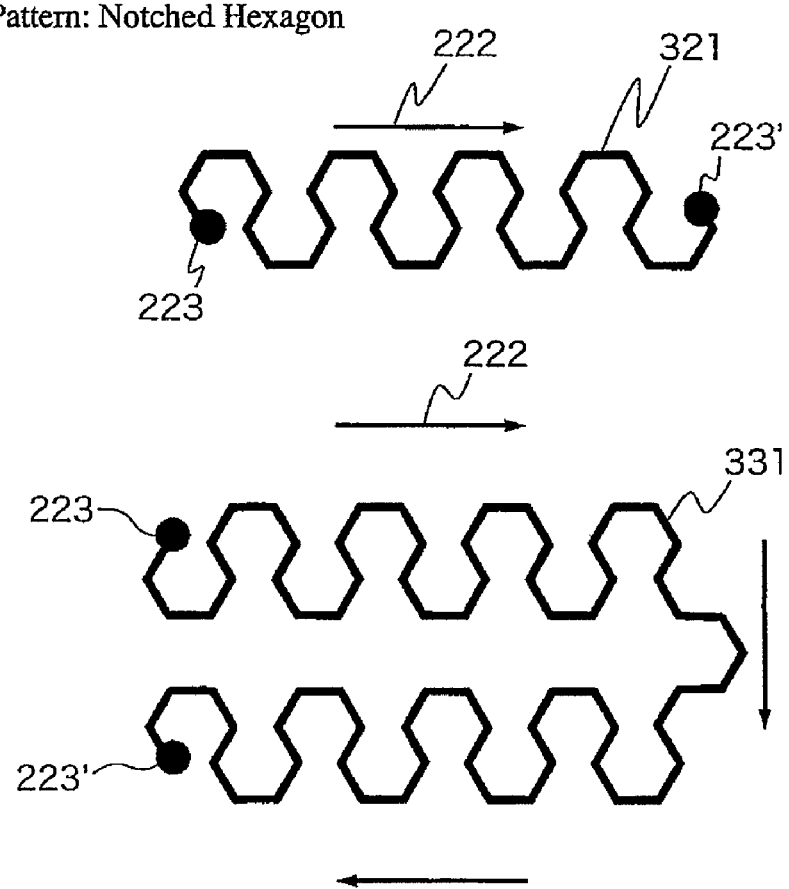
FIG. 9 is a schematic view showing magnetoresistive devices each formed by connecting pluralities of partially notched hexagons.

The shape-induced anisotropy direction $\theta_{dip}$, which is determined by the shape of the SVGMR device, is in alignment with the longitudinal direction of the device. For instance, in the case of a SVGMR device 221 formed by a straight line having a rectangular shape with a large aspect ratio or a device 231 formed by a folded straight line as shown in FIG. 4, $\theta_{dip}$ is in alignment with the direction 222 of current flowing between terminals 223, 223' (longitudinal direction of the device). In the case of SVGMR devices 241, 251 each formed by connecting pluralities of circles as shown in FIG. 5, $\theta_{dip}$ is in alignment with the direction 222 of current flowing between terminals 223, 223' (longitudinal direction of the device). In the case of SVGMR devices 261, 271, 281, 291, 301, 311, 321, 331 each formed by connecting pluralities of partially notched circles, semi-circles or polygons as shown in FIGS. 6-9, too, $\theta_{dip}$ is in alignment with the direction 222 of current (longitudinal direction of the device).

Figure 10:
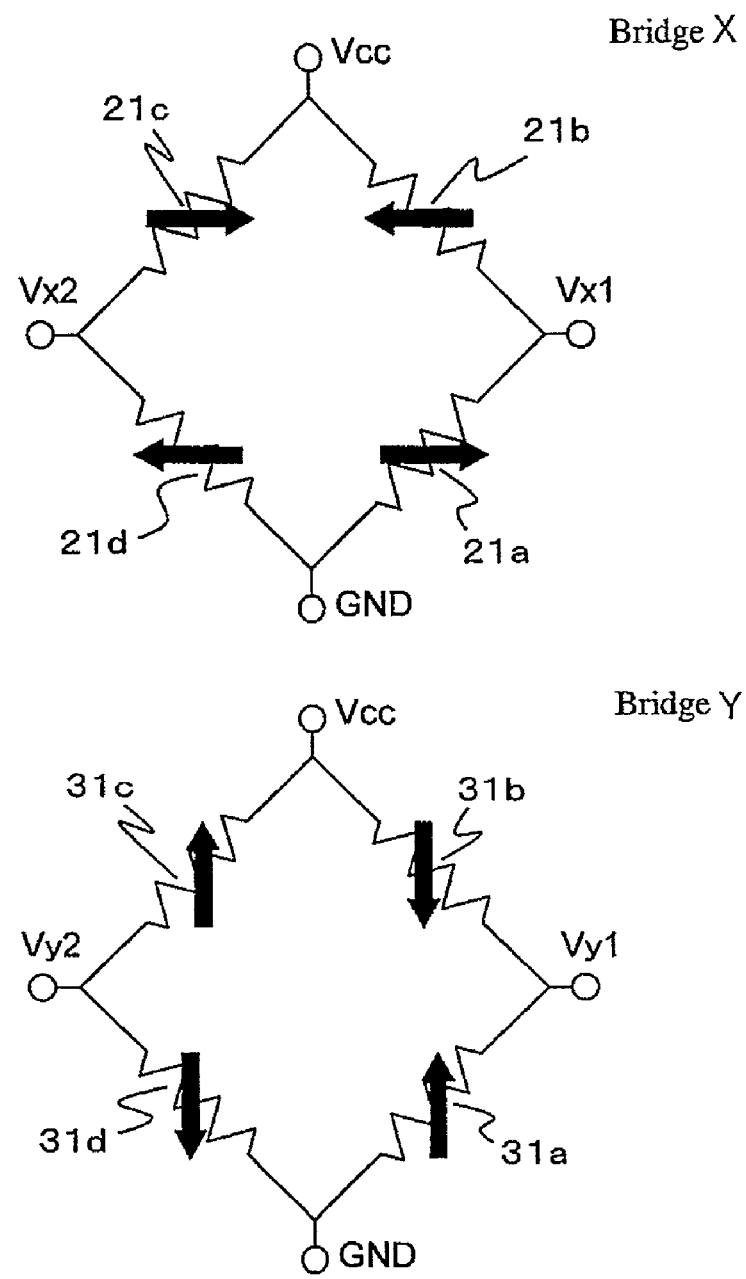
FIG. 10 is a view showing a magnetic sensor circuit constituted by bridge-connecting magnetoresistive devices.

FIG. 10 shows the equivalent circuit of a magnetic sensor in which SVGMR devices are bridge-connected. The magnetization direction of a pinned layer in each device is shown by an arrow in the figure. The magnetization direction of a pinned layer is the same between devices 21a and 21c, between devices 21b and 21d, between devices 31a and 31c, and between devices 31b and 31d. The magnetization direction of a pinned layer is antiparallel (180° opposite direction) between the devices 21a and 21b, and between the devices 31a and 31b, and the devices 21a and 31a have perpendicular magnetization directions of pinned layers. The devices 21a-21d constitute a bridge X, and the devices 31a-31d constitute a bridge Y. In an actual bridge circuit, perpendicular arrangement is made between the devices 21a and 31a, between the devices 21b and 31b, between the devices 21c and 31c, and between the devices 21d and 31d. Unless otherwise mentioned, an angle between a device and a magnetization direction of a pinned layer means an angle between a longitudinal direction of the device and the magnetization direction of a pinned layer. Voltages Vx1, Vx2, Vy1, Vy2 output from the bridge circuits are expressed by the following formulae (9)-(12):

$$V_{x1} = \left(\frac{R_{21a}}{R_{21a} + R_{21b}}\right) \times V_{cc}, \quad (9)$$

$$V_{x2} = \left(\frac{R_{21d}}{R_{21c} + R_{21d}}\right) \times V_{cc}, \quad (10)$$

$$V_{y1} = \left(\frac{R_{31a}}{R_{31a} + R_{31b}}\right) \times V_{cc}, \text{ and} \quad (11)$$

$$V_{y2} = \left(\frac{R_{31d}}{R_{31c} + R_{31d}}\right) \times V_{cc}. \quad (12)$$

The output voltage $V_x$ is obtained from $V_{x1}-V_{x2}$, and the output voltage $V_y$ is obtained from $V_{y1}-V_{y2}$. $V_x$ and $V_y$ have a substantially sinusoidal waveform. The difference between an angle $\theta_{calc}$ obtained from $V_x$ and $V_y$ by arctangent calculation and the angle $\theta_{app}$ of $H_{app}$ relative to the reference axis is an angle error $\theta_{err}$ of the magnetic sensor.

Embodiment 1

Angle Error of Magnetic Sensor Having Parallel Device Arrangement

Figure 11:
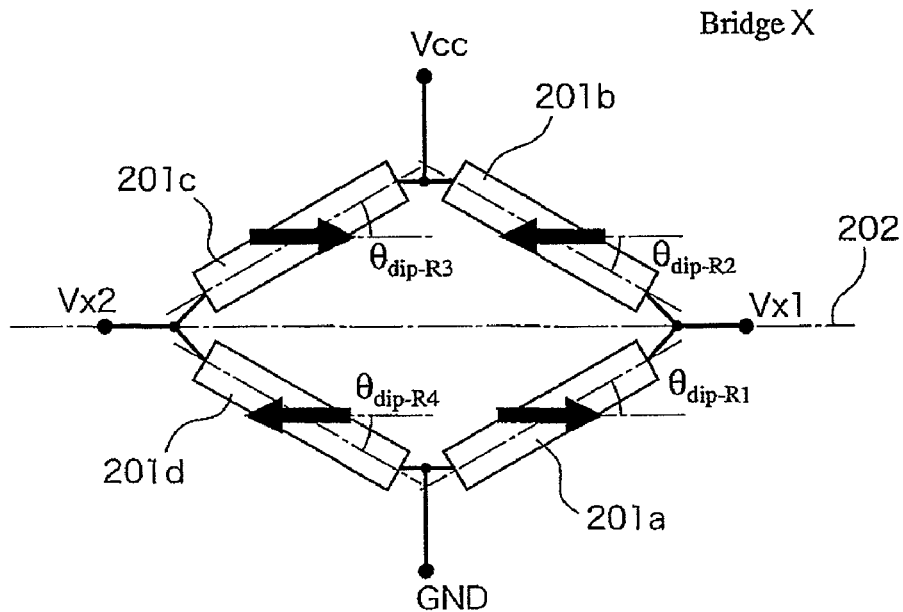
FIG. 11 is a schematic view showing the arrangement of magnetoresistive devices in the magnetic sensor according to one embodiment of the present invention.
Figure 11:
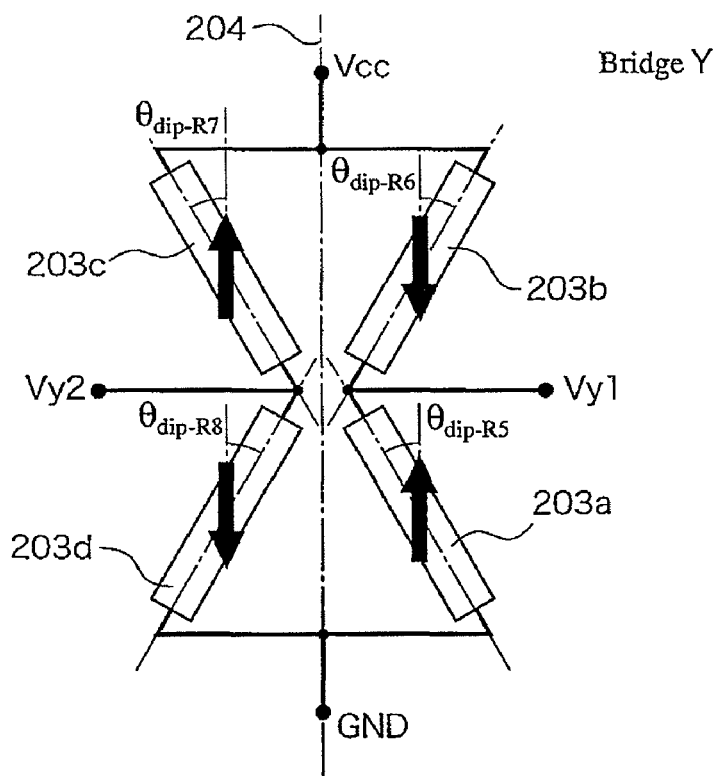

FIG. 11 shows a magnetic sensor comprising bridges X and Y constituted by SVGMR devices. In the bridge X, four rectangular SVGMR devices 201a-201d are formed on a substrate by patterning, the devices 201b and 201c being connected to a power supply terminal Vcc, the devices 201a and 201d being connected to a ground terminal GND, the devices 201a and 201b being connected to one output terminal Vx1, and the devices 201c and 201d being connected to the other output terminal Vx2. The longitudinal directions of the devices 201a-201d are inclined by angles $\theta_{dip-R1}$-$\theta_{dip-R4}$ relative to an axis 202 parallel to the magnetization directions of pinned layers shown by thick arrows. In the bridge Y, four rectangular SVGMR devices 203a-203d are formed on a substrate by patterning, each perpendicular to the corresponding devices 201a-201d in the bridge X. Although the magnetization direction of a pinned layer of each device is parallel to an axis 204 perpendicular to the axis 202, their longitudinal directions are inclined by angles $\theta_{dip-R5}$-$\theta_{dip-R8}$.

In the magnetic sensor shown in FIG. 11, the devices whose pinned layers have the same magnetization direction have parallel longitudinal directions. The $\theta_{dip}$ of each device 201a-201d, 203a-203d meets the following relation:

$\theta_{dip-R1}$ of device 201a=$\theta_{dip-R3}$ of device 201c,
$\theta_{dip-R2}$ of device 201b=$\theta_{dip-R4}$ of device 201d,
$\theta_{dip-R1}$=$-\theta_{dip-R2}$,
$\theta_{dip-R5}$ of device 203a=$\theta_{dip-R7}$ of device 203c,
$\theta_{dip-R6}$ of device 203b=$\theta_{dip-R8}$ of device 203d, and
$\theta_{dip-R5}$=$-\theta_{dip-R6}$.

Figure 13:
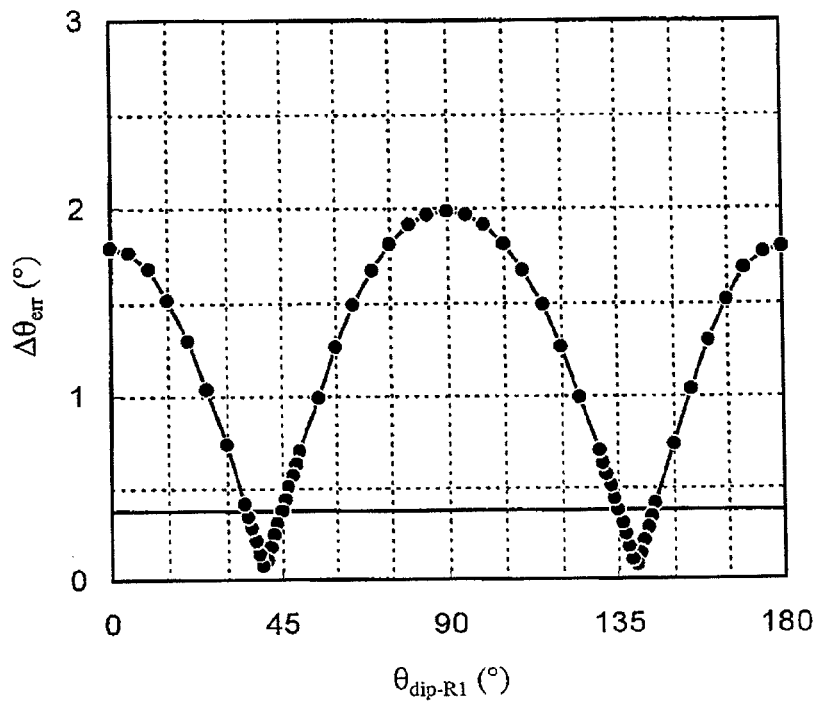
FIG. 13 is a graph showing the change of $\Delta\theta_{err}$ depending on $\theta_{dip}$ in a magnetoresistive device.

Assuming that a rightward direction was 0° in the bridge X, and that an upward direction was 0° in the bridge Y, $\theta_{dip}$ of each device 201a-201d, 203a-203d was changed as shown in Table 1 (the anticlockwise angle is expressed by "+") to determine the dependence of the variation range of $\theta_{err}$ ($\Delta\theta_{err}$) on $\theta_{dip-R1}$ by simulation. $\Delta\theta_{err}$ is a value obtained by subtracting the minimum $\theta_{err}$ from the maximum $\theta_{err}$ with $\theta_{app}$ changed from 0° to 360°. Assumed in this simulation are $M_S$=800 emu/cc, $H_k$=0.16 kA/m, $H_{kd}$=1.6 kA/m, $H_{app}$=24 kA/m, an angle between $\theta_{free}$ and a magnetization direction of a pinned layer in each SVGMR device=90°, dR/R (indicating a GMR ratio)=10%, and dR'=0, to neglect the AMR effect. The results are shown in FIG. 13. The larger the $\Delta\theta_{err}$, the larger the angle error of the magnetic sensor.

TABLE 1

| | $\theta_{dip}$ (°) of Each Device | | | |
|---|---|---|---|---|
| Condition | 201a, 201c | 201b, 201d | 203a, 203c | 203b, 203d |
| 1-1[1] | 0 | 0 | 0 | 0 |
| 1-2 | +5 | −5 | +5 | −5 |
| 1-3 | +30 | −30 | +30 | −30 |
| 1-4[2] | +40 | −40 | +40 | −40 |
| 1-5[3] | +45 | −45 | +45 | −45 |
| 1-6 | +85 | −85 | +85 | −85 |
| 1-7[4] | +90 | −90 | +90 | −90 |
| 1-8 | +95 (−85) | −95 (+85) | +95 (−85) | −95 (+85) |
| 1-9 | +140 (−40) | −140 (+40) | +140 (−40) | −140 (+40) |
| 1-10 | +175 (−5) | −175 (+5) | +175 (−5) | −175 (+5) |
| 1-11 | 180 (0) | 180 (0) | 180 (0) | 180 (0) |

Note:
[1]Comparative Example 1.
[2]Example 1.
[3]Comparative Example 2.
[4]Comparative Example 3.

The $\Delta\theta_{err}$ when the $\theta_{dip-R1}$ of the device 201a was 35-45° is shown in Table 2. When the arrangement angle $\Theta_{dip-R1}$ of the device 201a was 40° and 140° (or −40°) (conditions 1-4 and 1-9), the $\Delta\theta_{err}$ was as minimum as 0.076°. When the arrangement angle $\theta_{dip-R1}$ of the device 201a was 140° (or −40°), a mating device 201b constituting a half-bridge has an arrangement angle $\theta_{dip-R2}$ of −140° (or +40°), within the scope of the present invention.

TABLE 2

| $\theta_{dip-R1}$ | $\Delta\theta_{err}$ (°) |
|---|---|
| 35 | 0.4101 |
| 36 | 0.3438 |
| 37 | 0.2771 |
| 38 | 0.2102 |
| 39 | 0.1432 |
| 40 | 0.0762 |
| 41 | 0.1088 |
| 42 | 0.1763 |
| 43 | 0.2433 |
| 44 | 0.3099 |
| 45 | 0.3760 |

$\Delta\theta_{err}$ was about 1.8° in the condition 1-1. Thus, $\theta_{err}$ largely depends on $\theta_{dip}$, resulting in an angle error drastically changing depending on the device arrangement. As is clear from Table 2, a smaller angle error is obtained by the bridge circuit of the present invention in which the device arrangement angle $\theta_{dip}$ is 36° or more and less than 45°, than by a conventional bridge circuit in which the device arrangement angle $\theta_{dip}$ is 45°. In the case of a magnetic sensor in which devices whose pinned layers have the same magnetization direction are parallel, $\theta_{dip}$ is preferably 37-44°, more preferably 39-42°.

Figure 14:
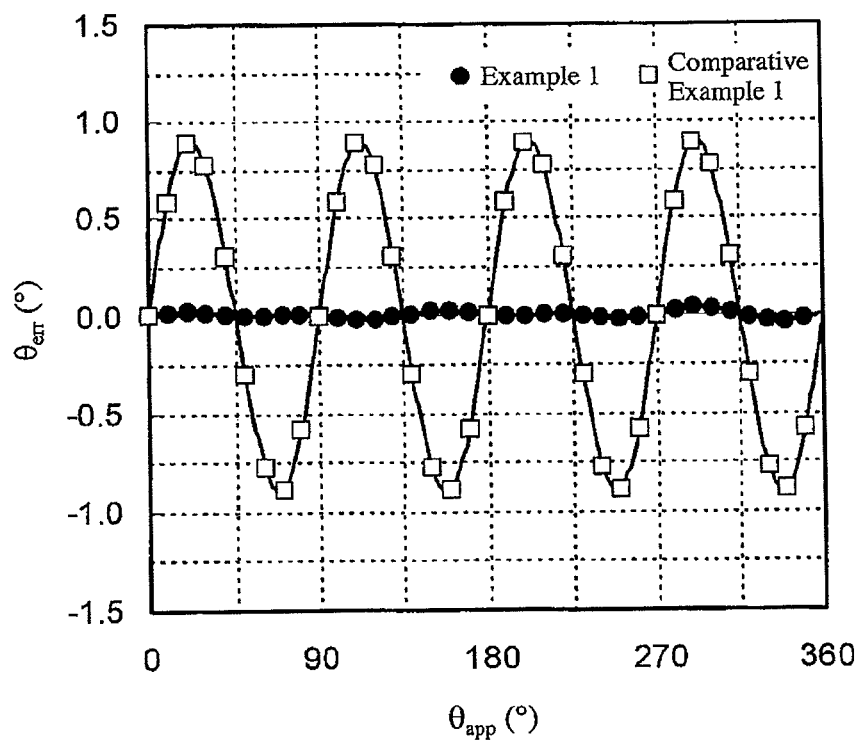
FIG. 14 is a graph showing the change of $\theta_{err}$ depending on $\theta_{app}$ in the magnetoresistive devices of Example 1 and Comparative Example 1.
Figure 15:
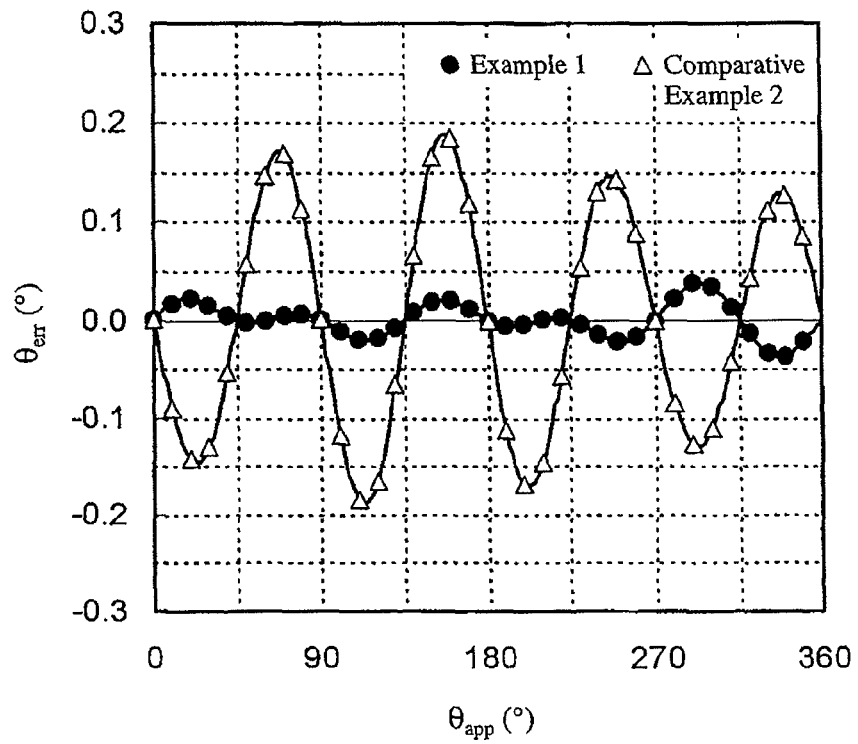
FIG. 15 is a graph showing the change of $\theta_{err}$ depending on $\theta_{app}$ in the magnetoresistive devices of Example 1 and Comparative Example 2.
Figure 16:
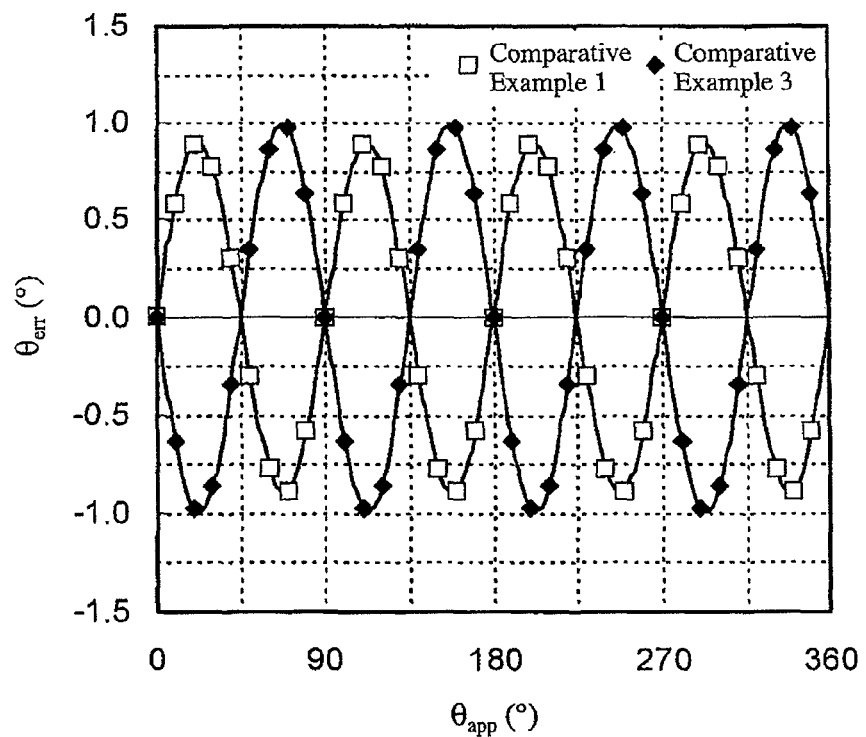
FIG. 16 is a graph showing the change of $\theta_{err}$ depending on $\theta_{app}$ in the magnetoresistive devices of Comparative Examples 1 and 3.

The dependence of $\theta_{err}$ on $\theta_{app}$ was determined by simulation in the condition 1-4 (Example 1), the condition 1-1 (Comparative Example 1), the condition 1-5 (Comparative Example 2) and the condition 1-7 (Comparative Example 3). The results are shown in FIGS. 14-16. The condition 1-5 (Comparative Example 2) corresponds to the device arrangement described in JP 2003-502876 A and JP 2005-024287 A. The maximum $\theta_{err}$ was about 0.04° in Example 1, while it was about 0.9° in Comparative Examples 1 and 3, and about 0.19° in Comparative Example 2. There is a large difference in $\theta_{err}$ between Example 1 and Comparative Example 2, despite as small difference in $\theta_{dip}$ as 5°. Because Comparative Examples 1 and 3 have different relations between $\theta_{dip}$ and the magnetization directions of pinned layers despite the same device arrangement, they have different dependence of $\theta_{err}$ on $\theta_{app}$. These results indicate that $\theta_{err}$ largely differs depending on the relation between $\theta_{dip}$ and the magnetization directions of pinned layers.

Figure 17:
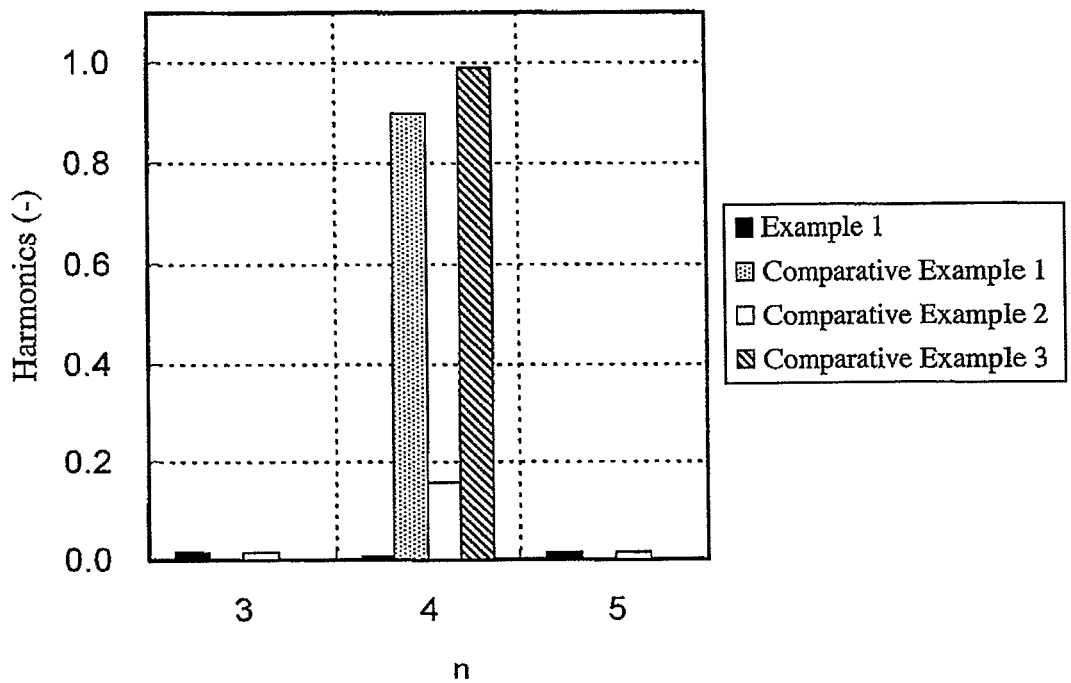
FIG. 17 is a graph showing the levels of harmonics determined by the analysis of $\theta_{err}$ in the magnetoresistive devices of Example 1 and Comparative Examples 1-3.
Figure 18:
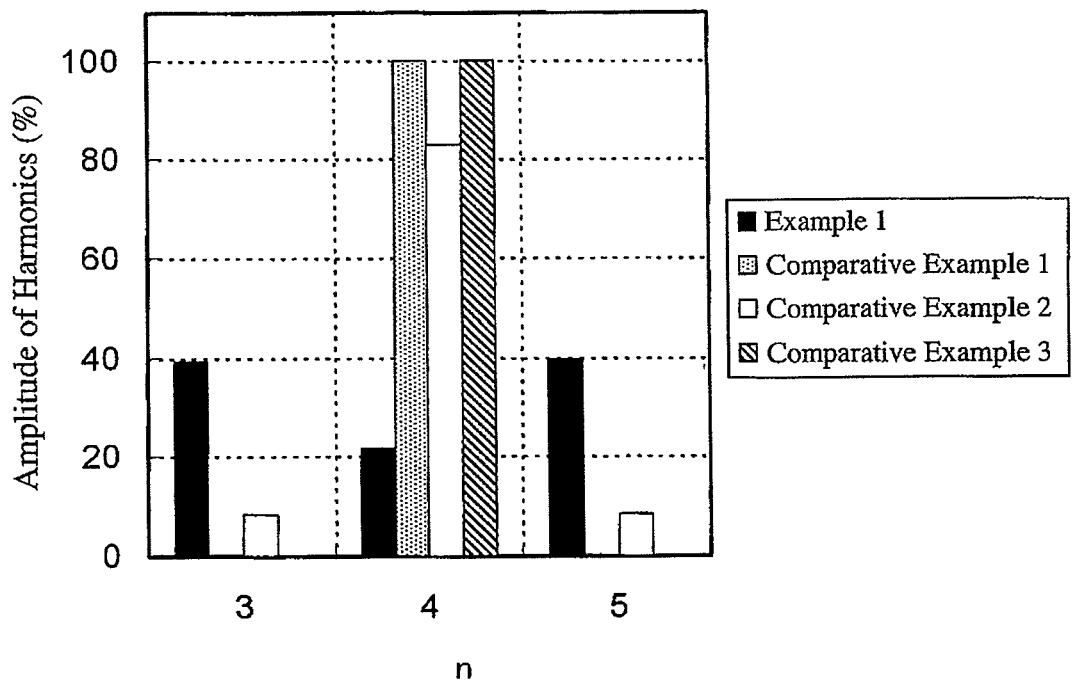
FIG. 18 is a graph showing the amplitudes of harmonics determined by the analysis of $\theta_{err}$ in the magnetoresistive devices of Example 1 and Comparative Examples 1-3.

To investigate this tendency in detail, the analysis of harmonics by the Fourier series expansion of $\theta_{err}$ in Example 1 and Comparative Examples 1-3 was conducted to determine up to fifth harmonics. Because first and second harmonics are much smaller than higher-order harmonics, with smaller dependence on $\theta_{dip}$, only third to fifth harmonics are shown in FIGS. 17 and 18. All harmonics were extremely small in Example 1 with small $\theta_{err}$, the amplitude being about 40% for both third and fifth harmonics, and about 20% for the fourth harmonics. Comparative Examples 1-3 with large $\theta_{err}$ had large fourth harmonics, the amplitude being about 80% for the fourth harmonics, and about 10% for each of the third and fifth harmonics. There were extremely large fourth harmonics particularly in Comparative Examples 1 and 3, in which $\theta_{dip}$ was perpendicular or parallel to the magnetization directions of pinned layers. It is thus clear that the reduction of the fourth harmonics greatly contributes to lowering $\theta_{err}$.

Figure 19:
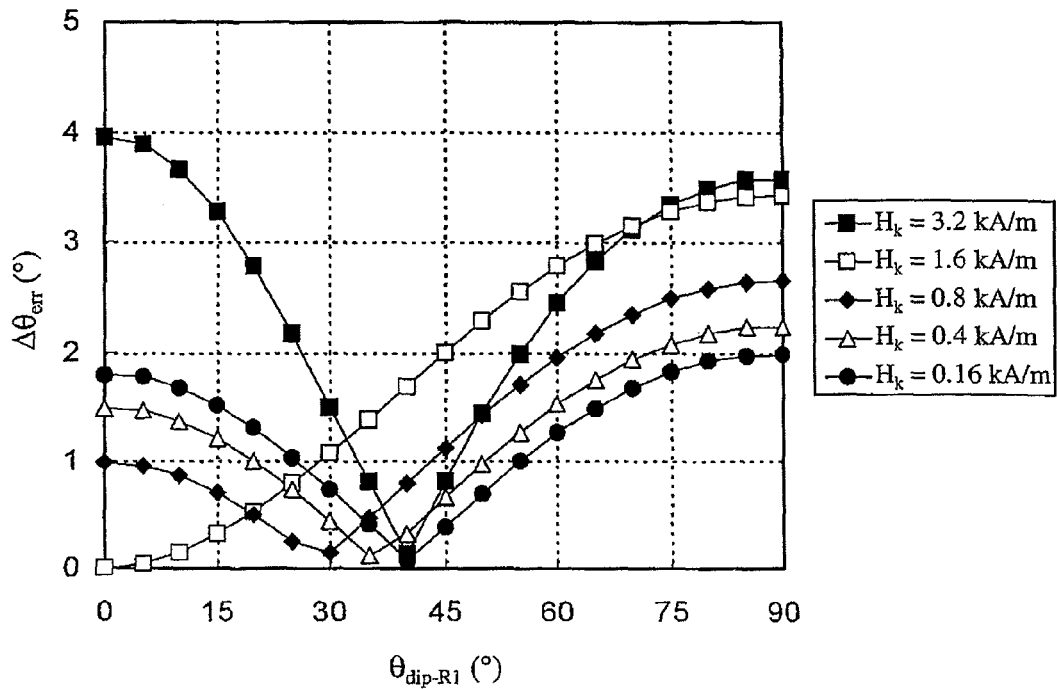
FIG. 19 is a graph showing the change of $\Delta\theta_{err}$ depending on $\theta_{dip}$ in a magnetoresistive device.

With the term of $\sin^2\theta$ in the formulae (2) and (3) in a magnetic sensor comprising SVGMR films, main causes of generating the fourth harmonics appear to be the device shape and the magnetic anisotropy of free layers, namely $H_{kd}$ and $H_k$. With $H_{kd}$ fixed to 1.6 kA/m, the magnetic anisotropy $H_k$ of the free layer was changed from 0.16 kA/m to 3.2 kA/m to determine the dependence of $\Delta\theta_{err}$ on $\theta_{dip}$ by simulation. The results are shown in FIG. 19. Lower $H_k$ provided the reduced dependence of $\Delta\theta_{err}$ on $\theta_{dip}$. The minimum $\Delta\theta_{err}$ was substantially the same (about 0.07-0.3°) irrespectively of $H_k$, $\theta_{dip}$ at the minimum $\Delta\theta_{err}$ was substantially in a range of 30-40°. Under the condition that $H_k$ was equal to $H_{kd}$ (=1.6 kA/m), $\Delta\theta_{err}$ was minimum at $\theta_{dip}=0°$ because $H_k$ and $H_{kd}$ canceled each other.

Figure 20:
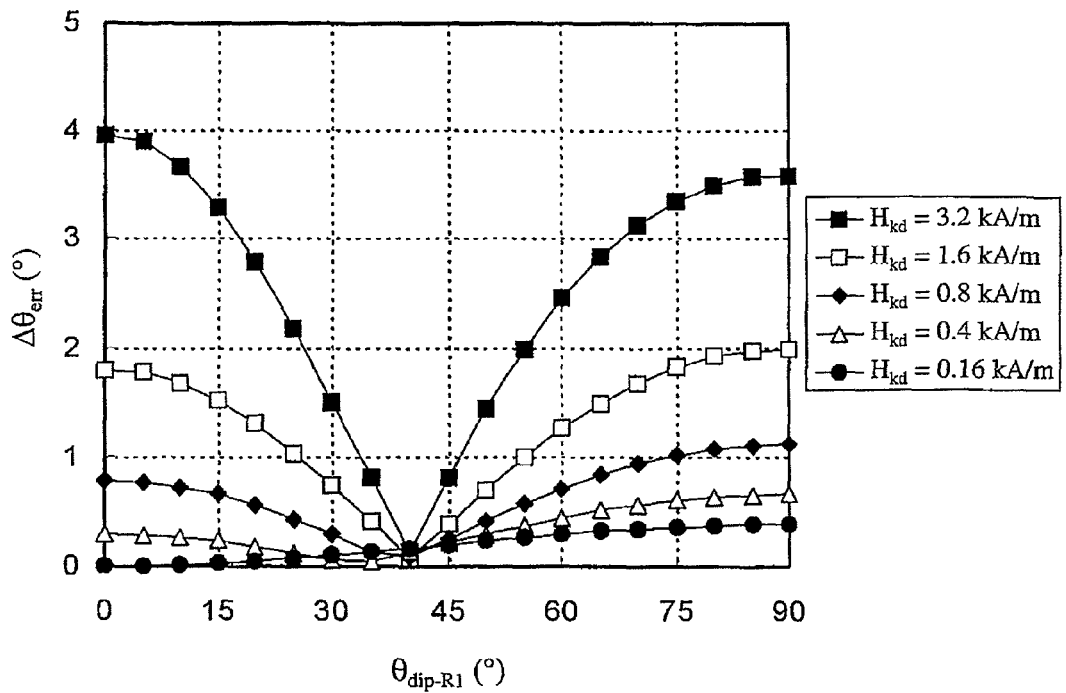
FIG. 20 is a graph showing the change of $\Delta\theta_{err}$ depending on $\theta_{dip}$ in a magnetoresistive device.

With $H_k$ fixed to 0.16 kA/m, $H_{kd}$ was changed from 0.16 kA/m to 3.2 kA/m to determine the dependence of $\Delta\theta_{err}$ on $\theta_{dip}$ by simulation. The results are shown in FIG. 20. As in the case of changing $H_k$, lower $H_{kd}$ provided smaller dependence of $\Delta\theta_{err}$ on $\theta_{dip}$, and $\theta_{dip}$ at the minimum $\Delta\theta_{err}$ was substantially in a range of 30-40°. The minimum $\Delta\theta_{err}$ was about 0.04-0.13°. Under the condition of $H_{kd}=H_k$, $\Delta\theta_{err}$ was minimum at $\theta_{dip}=0$. It is thus clear that the reduction of $H_k$ and/or $H_{kd}$ decreases angle error.

$H_k$ is determined solely by a material used for the free layer. Although $H_k$ is 0.16 kA/m ($H_k$ of NiFe generally used for the free layer) in this embodiment, the use of a material having lower $H_k$ may change coercivity, etc. Although $H_k$ can be reduced macroscopically by using a laminated ferrimagnetic free layer comprising two ferromagnetic layers via a nonmagnetic layer, such a free layer has large thickness, likely suffering increased distribution loss and decreased sensitivity. Further, because the SVGMR device has a limited length, it is not easy to make $H_{kd}$ depending on the device shape closer to 0. However, with the angle between $\theta_{dip}$ and the magnetization direction of a pinned layer within the range of the present invention (for instance, $\theta_{dip}=40°$), increase in $\theta_{err}$ can be suppressed despite the variation of $H_k$ due to the unevenness of the SVGMR film characteristics and the variation of $H_{kd}$ due to the device shape change, thereby providing a high-precision rotation-angle-detecting apparatus.

Embodiment 2

Angle Error of Magnetic Sensor with Non-Parallel Device Arrangement

Figure 21:
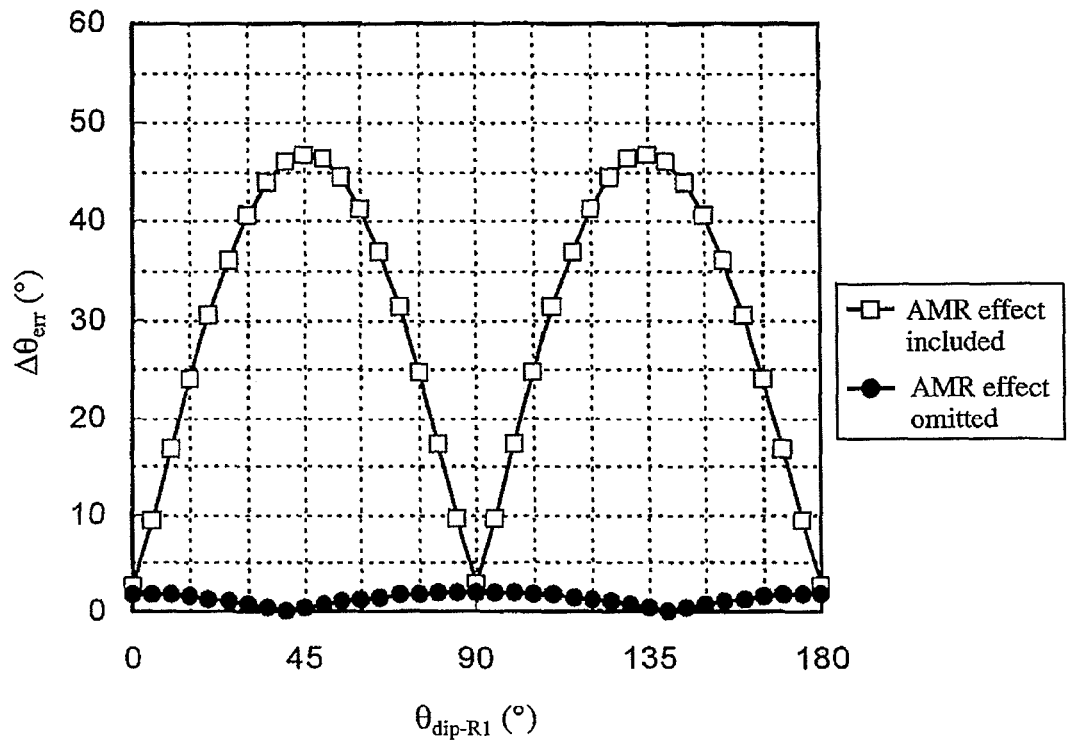
FIG. 21 is a graph showing the change of $\Delta\theta_{err}$ depending on $\theta_{dip}$ in a magnetoresistive device with or without an AMR effect included.

To suppress the power consumption of a magnetic sensor by increasing the resistance of SVGMR devices, some devices have longitudinal sizes of about several tens of micrometers to one hundred micrometers. Such long devices increase the shape-induced anisotropy of a free layer in an SVGMR film. In such circumstances, the AMR effect differently affects the angle error of the magnetic sensor. Accordingly, $\theta_{dip-R1}$ was changed as shown in Table 3 in a magnetic sensor having the device arrangement shown in FIG. 11 to determine $\Delta\theta_{err}$ by simulation in both cases where the AMR effect was included and neglected. The results are shown in FIG. 21. In Table 3, the anticlockwise angle is expressed by "+." In the formula (8), it was assumed from the thickness ratio of a free layer to the SVGMR film and the specific resistance of a NiFe film that the resistance contributing to AMR was 7500Ω, and that the AMR ratio was 0.3% to derive dR' of 22.5Ω. Comparative Example 5 has the device arrangement described in JP 2003-502876 A and JP 2005-024287 A.

TABLE 3

| | $\theta_{dip}$ (°) of Each Device | | | |
|---|---|---|---|---|
| Condition | 201a, 201c | 201b, 201d | 203a, 203c | 203b, 203d |
| 2-1[1] | 0 | 0 | 0 | 0 |
| 2-2 | +5 | −5 | +5 | −5 |
| 2-3 | +30 | −30 | +30 | −30 |
| 2-4 | +40 | −40 | +40 | −40 |
| 2-5[2] | +45 | −45 | +45 | −45 |
| 2-6 | +85 | −85 | +85 | −85 |
| 2-7[3] | +90 | −90 | +90 | −90 |
| 2-8 | +95 (−85) | −95 (+85) | +95 (−85) | −95 (+85) |
| 2-9 | +140 (−40) | −140 (+40) | +140 (−40) | −140 (+40) |
| 2-10 | +175 (−5) | −175 (+5) | +175 (−5) | −175 (+5) |
| 2-11 | 180 (0) | 180 (0) | 180 (0) | 180 (0) |

Note:
[1]Comparative Example 4.
[2]Comparative Example 5.
[3]Comparative Example 6.

When the AMR effect was included, $\Delta\theta_{err}$ was as minimum as about 2.6° in Comparative Example 4 ($\theta_{dip}=0°$) and Comparative Example 6 ($\theta_{dip}=90°$), and as maximum as about 47° in Comparative Example 5 ($\theta_{dip}=45°$). Because each device pair (for instance, 201a and 201c, and 201b and 201d) in the same bridge has opposite current directions in any device arrangements, the contribution of the AMR effect to the angle error depends on the direction of sensing current and the axis of easy magnetization of the free layer.

Figure 12:
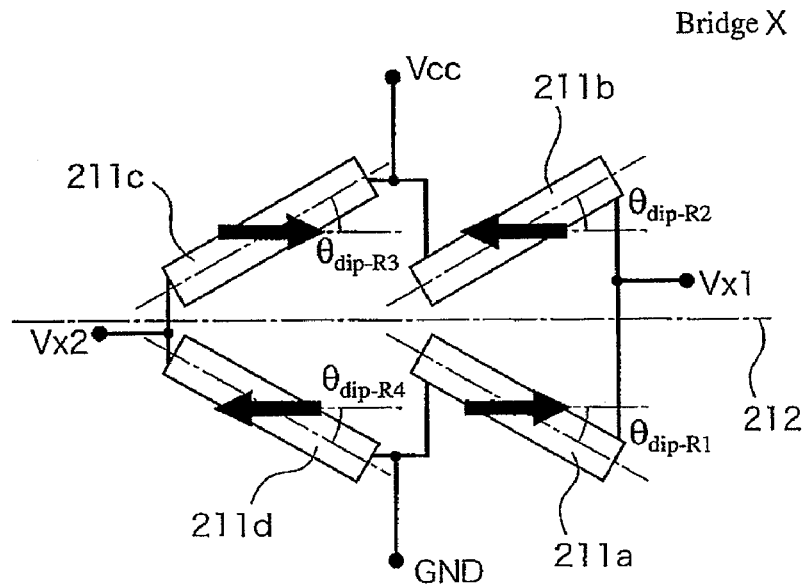
FIG. 12 is a schematic view showing the arrangement of magnetoresistive devices in the magnetic sensor according to another embodiment of the present invention.
Figure 12:
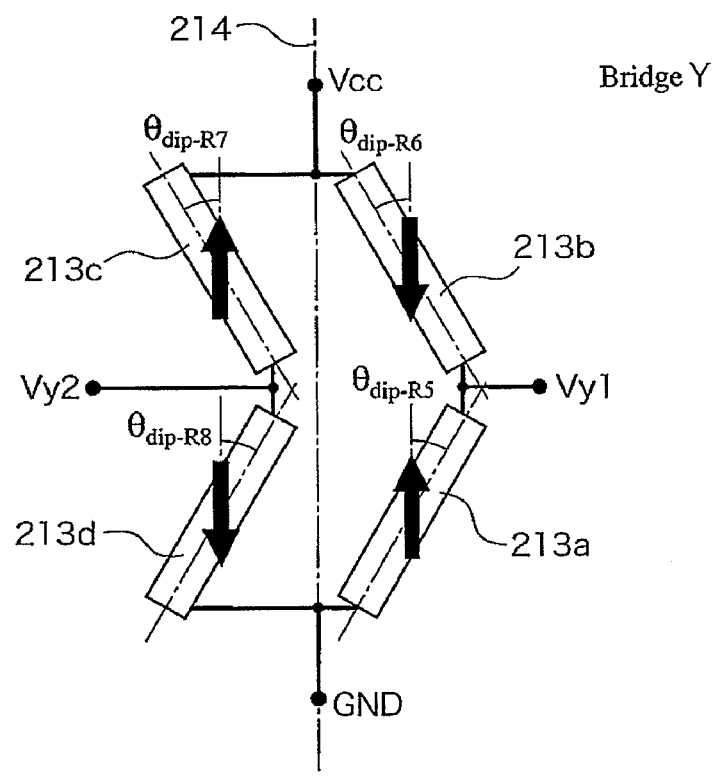

FIG. 12 shows a magnetic sensor effectively suppressing the AMR effect. In FIG. 12, the magnetization directions of pinned layers are horizontal in the bridge X and vertical in the bridge Y In the bridge X, the devices 211a and 211c comprise pinned layers having the same magnetization direction, and the devices 211b and 211d comprise pinned layers having the same magnetization direction. The same is true of the bridge Y Devices comprising pinned layers having the same magnetization direction have non-parallel longitudinal directions in each bridge. Each device 211a-d, 213a-d has a rectangular shape like in FIG. 11.

The $\theta_{dip}$ of each device in the bridge X (devices 211a-211d) and bridge Y (devices 213a-213d) is as follows:

$\theta_{dip-R1}$ of device 211a=$\theta_{dip-R4}$ of device 211d,
$\theta_{dip-R2}$ of device 211b=$\theta_{dip-R3}$ of device 211c,
$\theta_{dip-R1}$=$-\theta_{dip-R2}$,
$\theta_{dip-R5}$ of device 213a=$\theta_{dip-R8}$ of device 213d,
$\theta_{dip-R6}$ of device 213b=$\theta_{dip-R7}$ of device 213c, and
$\theta_{dip-R5}$=$-\theta_{dip-R6}$.

Figure 22:
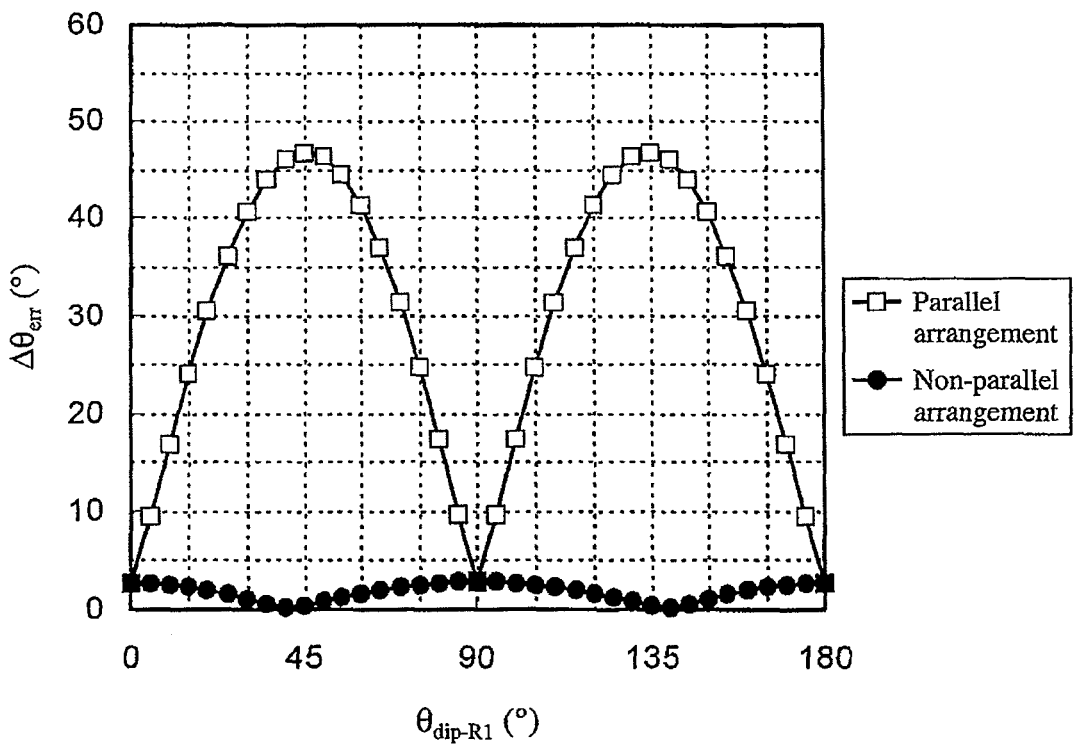
FIG. 22 is a graph showing the change of $\Delta\theta_{err}$ depending on $\theta_{dip}$ in a magnetoresistive device in a bridge comprising magnetoresistive devices whose pinned layers have parallel magnetization directions.

Assuming that a rightward direction was 0° in the bridge X, and that an upward direction was 0° in the bridge Y, the $\theta_{dip}$ of each device 211a-211d, 213a-213d was changed as shown in Table 4 (the clockwise angle is expressed by "+") to determine the dependence of $\Delta\theta_{err}$ on $\theta_{dip}$ by simulation with the AMR effect included. The results are shown in FIG. 22. $\Delta\theta_{err}$ when the arrangement angle $\theta_{dip-R1}$ of the device 211a was 35-45° is shown in Table 5.

TABLE 4

| Condition | $\theta_{dip}$ (°) of Each Device | | | |
|---|---|---|---|---|
| | 211b, 211c | 211a, 211d | 213b, 213c | 213a, 213d |
| 3-1[1] | 0 | 0 | 0 | 0 |
| 3-2 | +5 | −5 | +5 | −5 |
| 3-3 | +30 | −30 | +30 | −30 |
| 3-4[2] | +40 | −40 | +40 | −40 |
| 3-5[3] | +45 | −45 | +45 | −45 |
| 3-6 | +85 | −85 | +85 | −85 |
| 3-7 | +90 | −90 | +90 | −90 |
| 3-8 | +95 (−85) | −95 (+85) | +95 (−85) | −95 (+85) |
| 3-9 | +140 (−40) | −140 (+40) | +140 (−40) | −140 (+40) |
| 3-10 | +175 (−5) | −175 (+5) | +175 (−5) | −175 (+5) |
| 3-11 | 180 (0) | 180 (0) | 180 (0) | 180 (0) |

Note:
[1]Comparative Example 8.
[2]Example 2.
[3]Comparative Example 7.

TABLE 5

| $\theta_{dip-R1}$ | $\Delta\theta_{err}$ (°) |
|---|---|
| 35 | 0.6087 |
| 36 | 0.5139 |
| 37 | 0.4187 |
| 38 | 0.3232 |
| 39 | 0.2275 |
| 40 | 0.1317 |
| 41 | 0.0360 |
| 42 | 0.0595 |
| 43 | 0.1547 |
| 44 | 0.2494 |
| 45 | 0.3435 |

When a device pair on the power source terminal side was not parallel to a device pair on the ground terminal side, $\Delta\theta_{err}$ was as small as when the AMR effect was neglected (corresponding to FIG. 13), and $\Delta\theta_{err}$ was as small as 0.1317° particularly in Example 2 (condition 3-4) in which $\theta_{dip}$ was 40°. In the arrangement of Comparative Example 7 (condition 3-5 of $\theta_{dip}$=45°) in which devices comprising pinned layers having the same magnetization direction were perpendicular to each other, $\Delta\theta_{err}$ was 0.3435°. This indicates that the angle error is smaller in the bridge circuit of the present invention in which $\theta_{dip}$ is 38° or more and less than 45° than in the conventional bridge circuit in which $\theta_{dip}$ is 45°. In the case of a magnetic sensor in which devices comprising pinned layers having the same magnetization direction are not parallel, $\theta_{dip}$ is preferably 39-44°, more preferably 40-43°.

Figure 23:
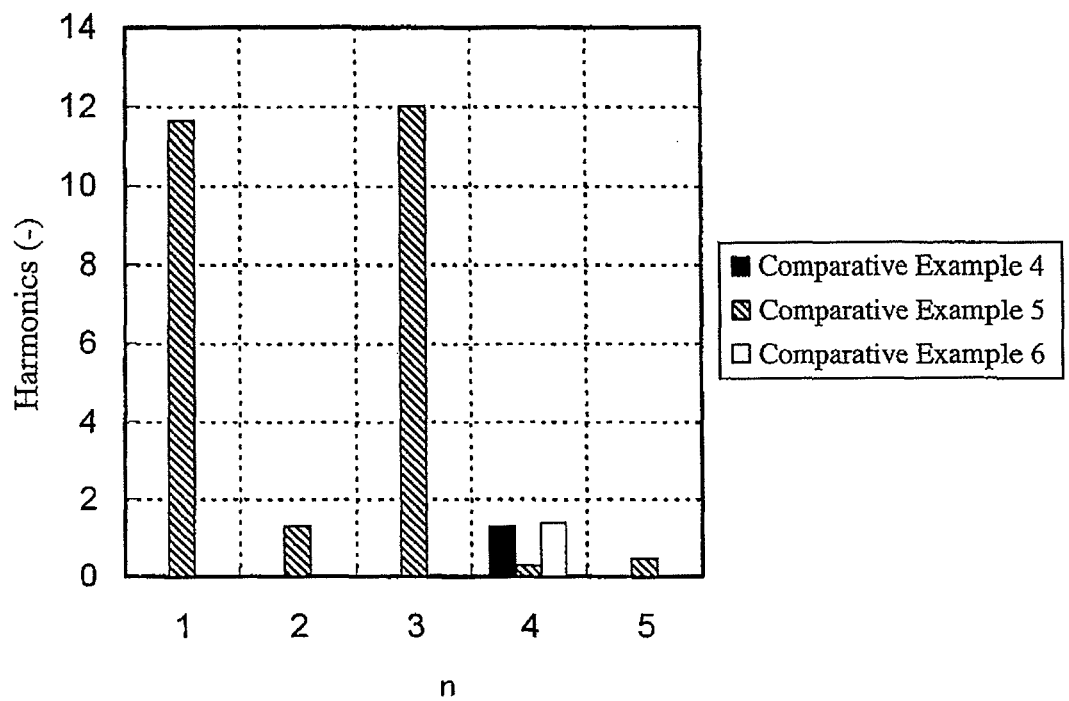
FIG. 23 is a graph showing harmonics determined by the analysis of $\theta_{err}$ in the magnetoresistive devices of Comparative Examples 4-6.
Figure 24:
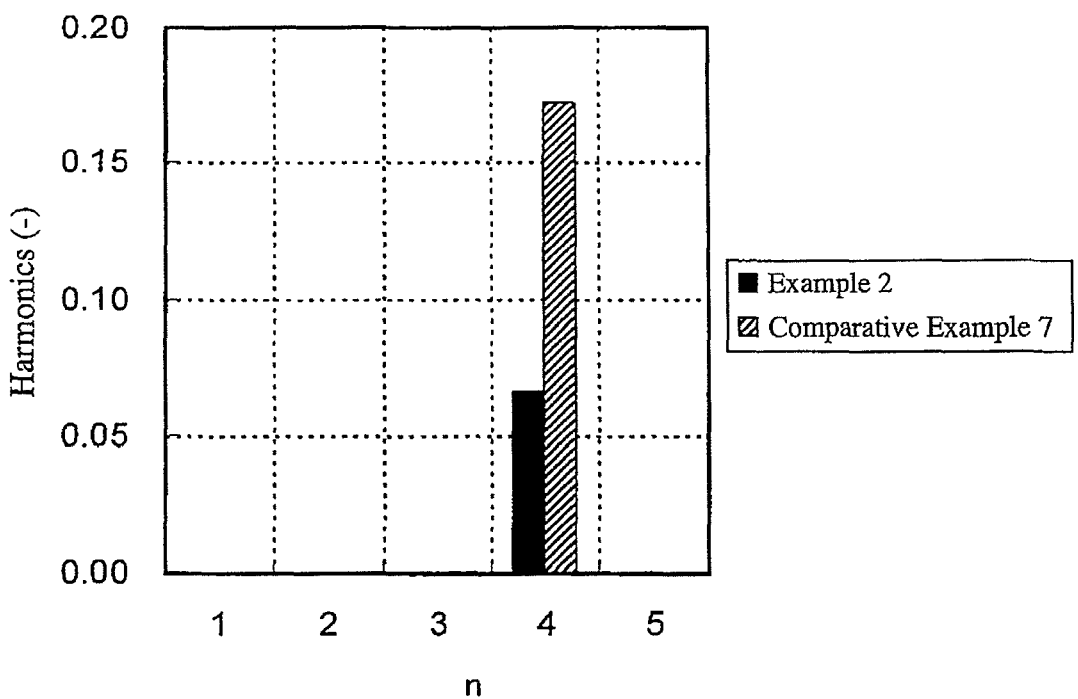
FIG. 24 is a graph showing harmonics determined by the analysis of $\theta_{err}$ in the magnetoresistive devices of Example 2 and Comparative Example 7.

To investigate the effect of reducing angle error in more detail, the analysis of $\theta_{err}$ was conducted to up to fifth harmonics. The harmonics analysis results in Comparative Examples 4-6 (conditions 2-1, 2-5 and 2-7 in Table 3) with a parallel device arrangement are shown in FIG. 23, and the harmonics analysis results in Example 2 and Comparative Example 7 (conditions 3-4 and 3-5 in Table 4) with a non-parallel device arrangement are shown in FIG. 24. In the case of the parallel device arrangement, substantially all harmonics appearing in Comparative Examples 4 and 6 with relatively small $\theta_{err}$ are fourth harmonics. On the other hand, Comparative Example 5 with large $\theta_{err}$ includes all harmonics up to fifth harmonics, first and third harmonics being particularly large. Although it is expected from the formula (8) that the AMR effect should appear as fourth harmonics, large third harmonics appeared because of the device arrangement. There were substantially no harmonics other than fourth harmonics in Example 2 and Comparative Example 7 with a non-parallel device arrangement, and the fourth harmonics were extremely smaller in Example 2.

Figure 25:
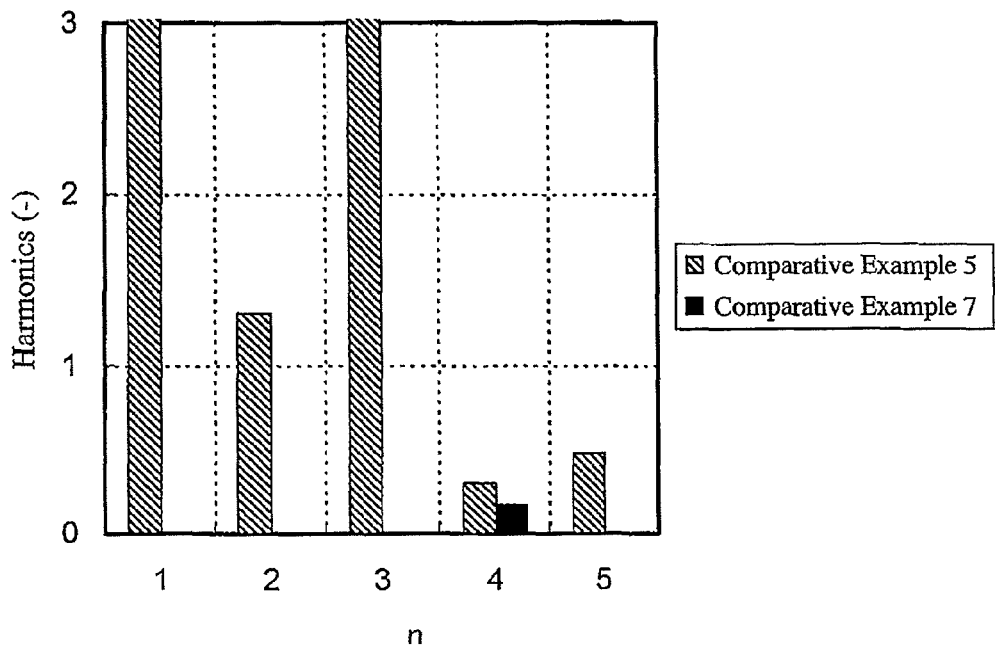
FIG. 25 is a graph showing harmonics determined by the analysis of $\theta_{err}$ in the magnetoresistive devices of Comparative Examples 5 and 7.

FIG. 25 shows harmonics in Comparative Example 5 having $\theta_{dip}$ of 45° and a parallel device arrangement, and Comparative Example 7 having $\theta_{dip}$ of 45° and a non-parallel device arrangement. In Comparative Example 7 with a non-parallel device arrangement, there are substantially no harmonics other than fourth harmonics, and the fourth harmonics are substantially half of those of Comparative Example 5 with a parallel device arrangement. To reduce $\theta_{err}$, it is necessary to reduce the first or third harmonics to substantially 0, and extremely reduce the fourth harmonics.

Embodiment 3

Investigation of Influence of $H_{int}$ Variation on Angle Error

Figure 26:
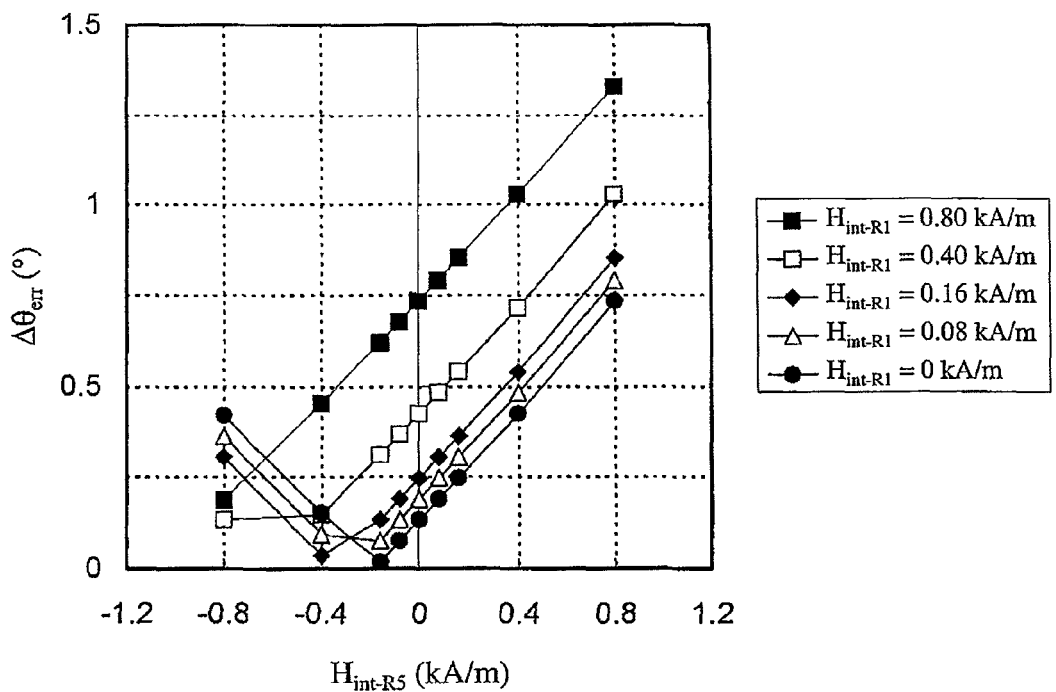
FIG. 26 is a graph showing the change of $\Delta\theta_{err}$ depending on $H_{int}$ in a magnetoresistive device.

The most variable magnetic property in the SVGMR film is a magnetic field $H_{int}$ acting between a pinned layer and a free layer via an intermediate layer. $H_{int}$ is easily variable depending on the thickness variation of the intermediate layer, a so-called "orange peel effect" due to the surface roughness of the intermediate layer, temperatures such as an operation temperature and an ambient temperature, etc. To determine the relation between $H_{int}$ and $\Delta\theta_{err}$ in the optimum device arrangement (Example 2), $\Delta\theta_{err}$ was determined by simulation with the $H_{int}$ of the device 213a ($H_{int-R5}$) changed from −0.8 kA/m to +0.8 kA/m at $H_{int-R1}$ of 0 kA/m, 0.08 kA/m, 0.16 kA/m, 0.40 kA/m and 0.80 kA/m, in the magnetic sensor shown in FIG. 12. The results are shown in FIG. 26.

$H_{int-R1}$ of device 211a=$H_{int-R4}$ of device 211d,
$H_{int-R2}$ of device 211b=$H_{int-R3}$ of device 211c,
$H_{int-R1}$=$-H_{int-R2}$,
$H_{int-R5}$ of device 213a=$H_{int-R8}$ of device 213d,
$H_{int-R6}$ of device 213b=$H_{int-R7}$ of device 213c, and
$H_{int-R5}$=$-H_{int-R6}$.

Smaller $\Delta\theta_{err}$ was obtained by smaller $H_{int-R1}$, and $\Delta\theta_{err}$ was substantially minimum when $H_{int-R5}$ changed its sign. $\Delta\theta_{err}$ was 1° or less at $H_{int-R1}$ of 0.16 kA/m or less, and $\Delta\theta_{err}$ was also 1° or less even at $H_{int-R1}$ of 0.4 kA/m or more as long as $H_{int-R5}$ was within ±0.4 kA/m. This indicates that the angle error can be suppressed when the variation of $H_{int}$ is within ±0.4 kA/m in the magnetic sensor of the present invention, thereby providing a magnetic sensor with small angle error even when there are thickness variation in the intermediate layer and the variation of $H_{int}$ at high temperatures.

Embodiment 4

Rotation-Angle-Detecting Apparatus

Figure 27:
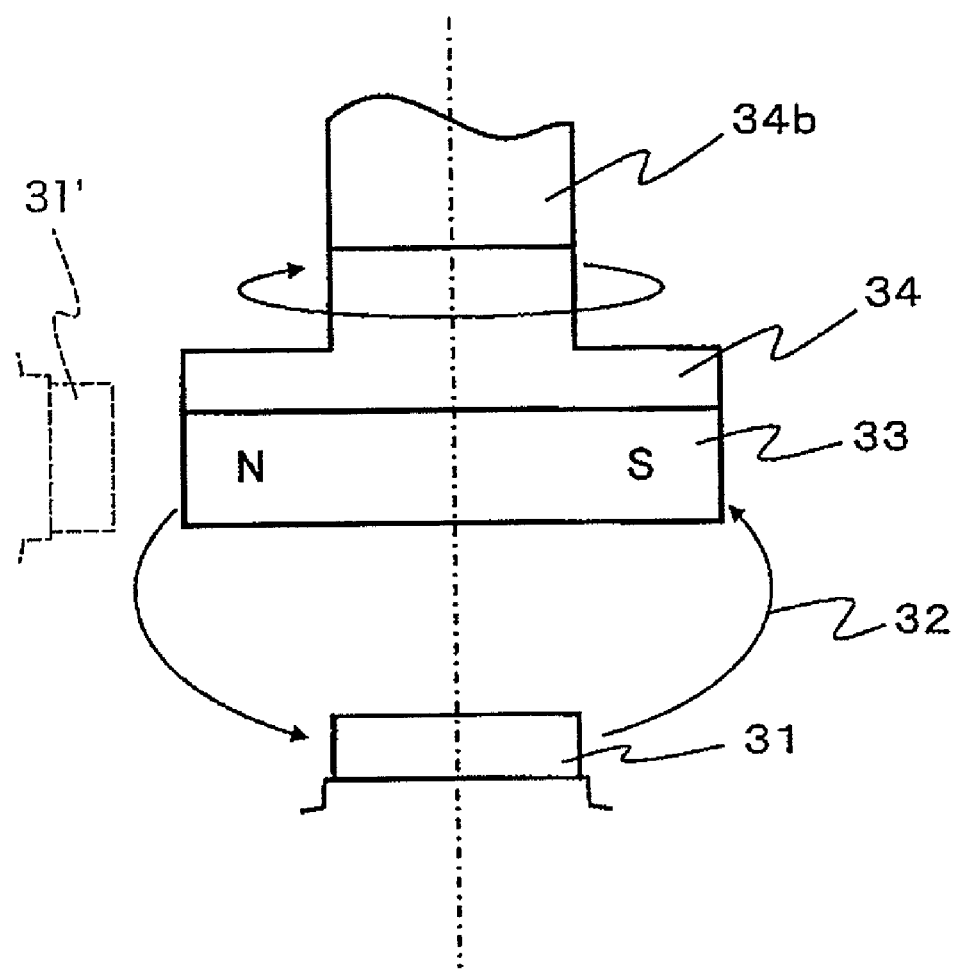
FIG. 27 is a side view showing a rotation-angle-detecting apparatus.

FIG. 27 shows one example of the rotation-angle-detecting apparatuses of the present invention. This apparatus comprises a magnetic sensor 31 comprising bridge-connected SVGMR devices, a disc-shaped permanent magnet 33 opposing the magnetic sensor 31 and diametrically having two magnetic poles, a jig 34 fixedly supporting the permanent magnet 33, and a rotatable shaft 34b integral with the jig 34, the rotation of the permanent magnet 33 changing a leaking magnetic field. In FIG. 27, a dotted line represents a rotation center axis, and an arrow 32 represents a magnetic flux line. The in-plane change of a magnetic field in the SVGMR device was detected by the magnetic sensor 31. The device arrangement of the present invention provides a magnetic sensor 31 having high resistance to the unevenness of shape-induced anisotropy $H_{kd}$ in the SVGMR devices, the unevenness of $H_k$ and $H_{int}$ due to the characteristics of the SVGMR film, etc., and a high-precision, rotation-angle-detecting apparatus.

Another example of the rotation-angle-detecting apparatuses of the present invention shown in FIG. 27 differs only in that the magnetic sensor is displaced from 31 to 31'. A substrate surface of the magnetic sensor 31' faces a peripheral surface of the permanent magnet 33, with a center axis parallel to the rotation center axis. This structure also can reduce output distortion.

Figure 28:
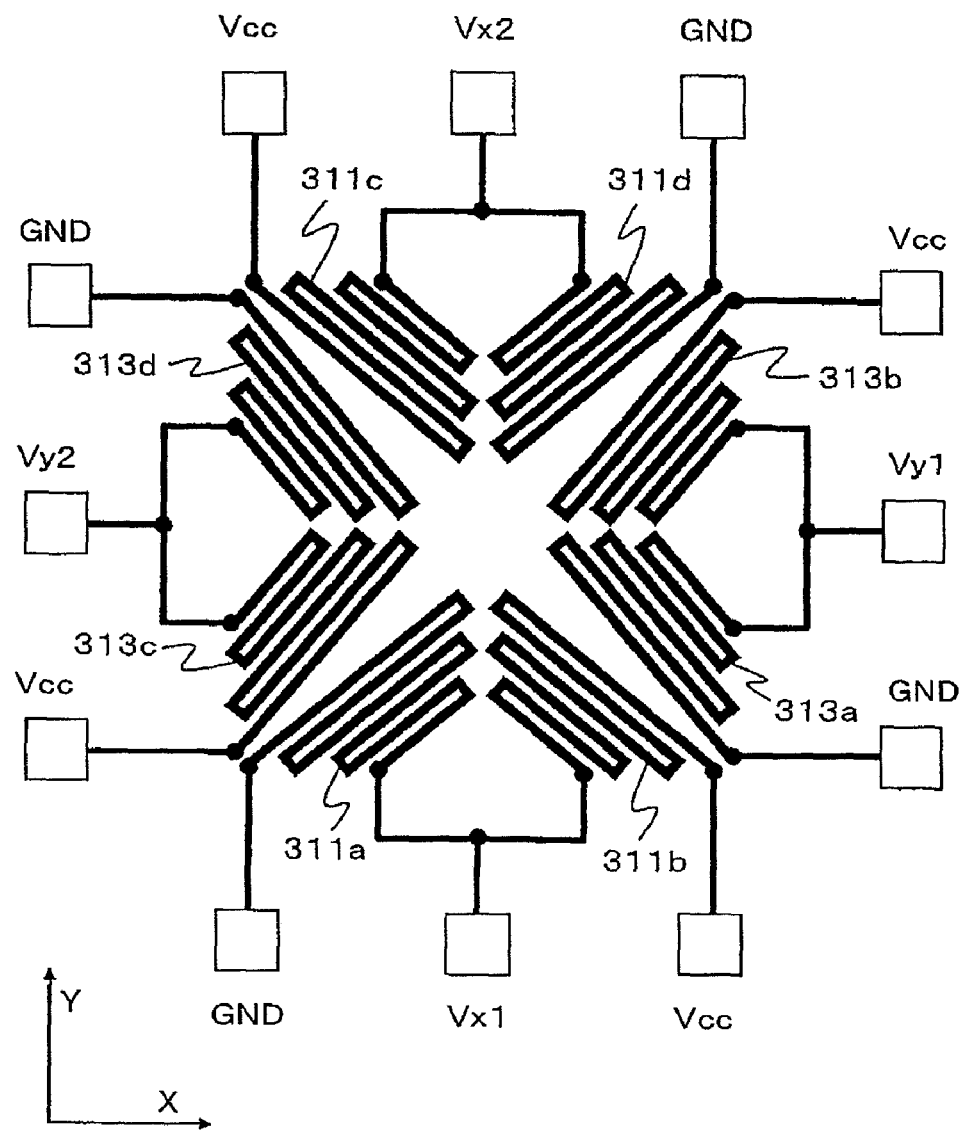
FIG. 28 is a schematic view showing one example of bridge circuits comprising magnetoresistive devices.
Figure 29:
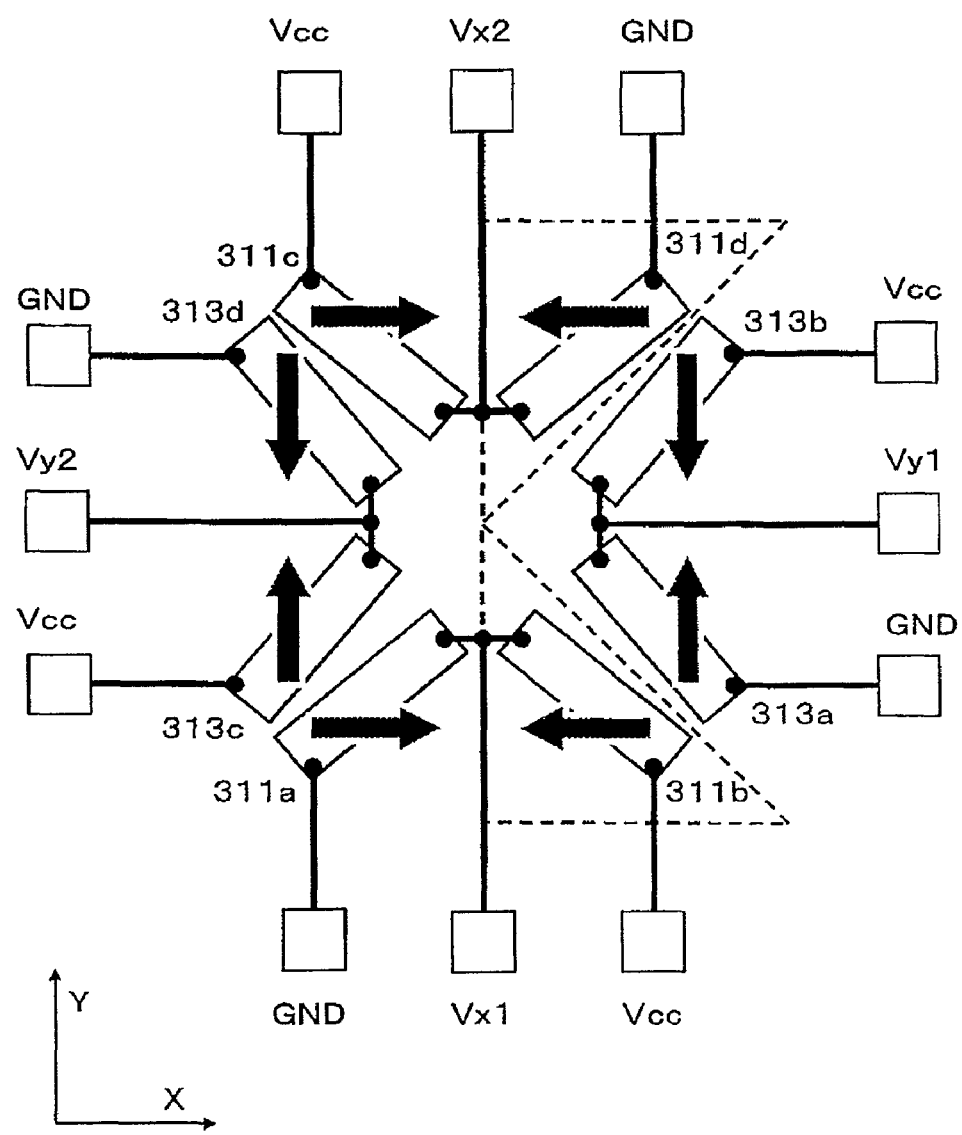
FIG. 29 is a schematic view showing one example of bridge circuits comprising magnetoresistive devices, to which a magnetization direction of a pinned layer is added.

FIG. 28 specifically shows the arrangement of devices in the bridge circuit shown in FIG. 12. In the figure, the arrows X and Y show the side directions of a sensor chip constituting the device. FIG. 29 schematically shows the device arrangement of FIG. 28 together with the magnetization directions of pinned layers (shown by arrows). Devices 311a and 311c, devices 311b and 311d (encircled by the dotted line for example), . . . , etc., whose pinned layers have the same magnetization direction, are inclined by a desired angle (for instance, ±40°) from the magnetization directions of the pinned layers. However, the devices 311a and 311c are not parallel, and the devices 311b and 311d are not parallel, resulting in canceling the AMR effect.

Figure 30:
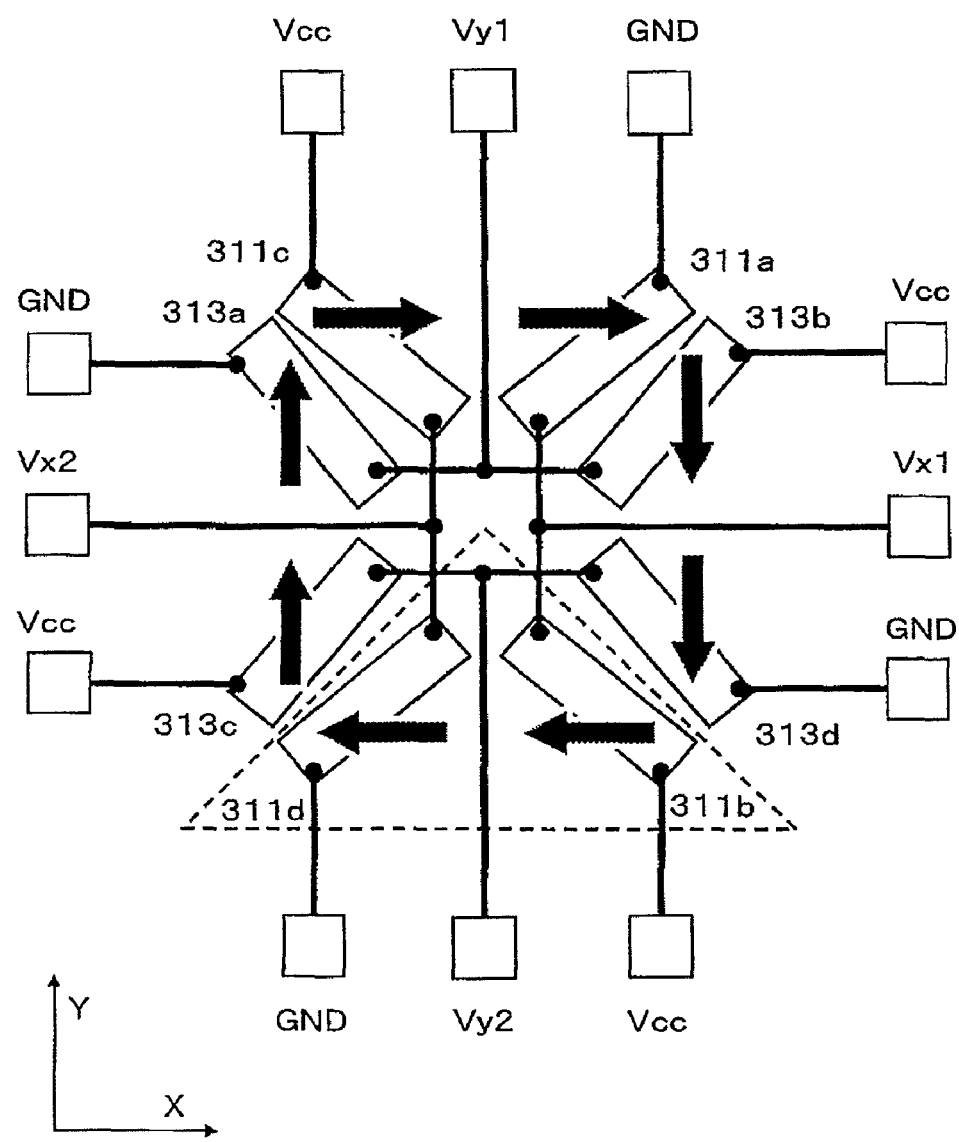
FIG. 30 is a schematic view showing another example of bridge circuits comprising magnetoresistive devices.
Figure 31:
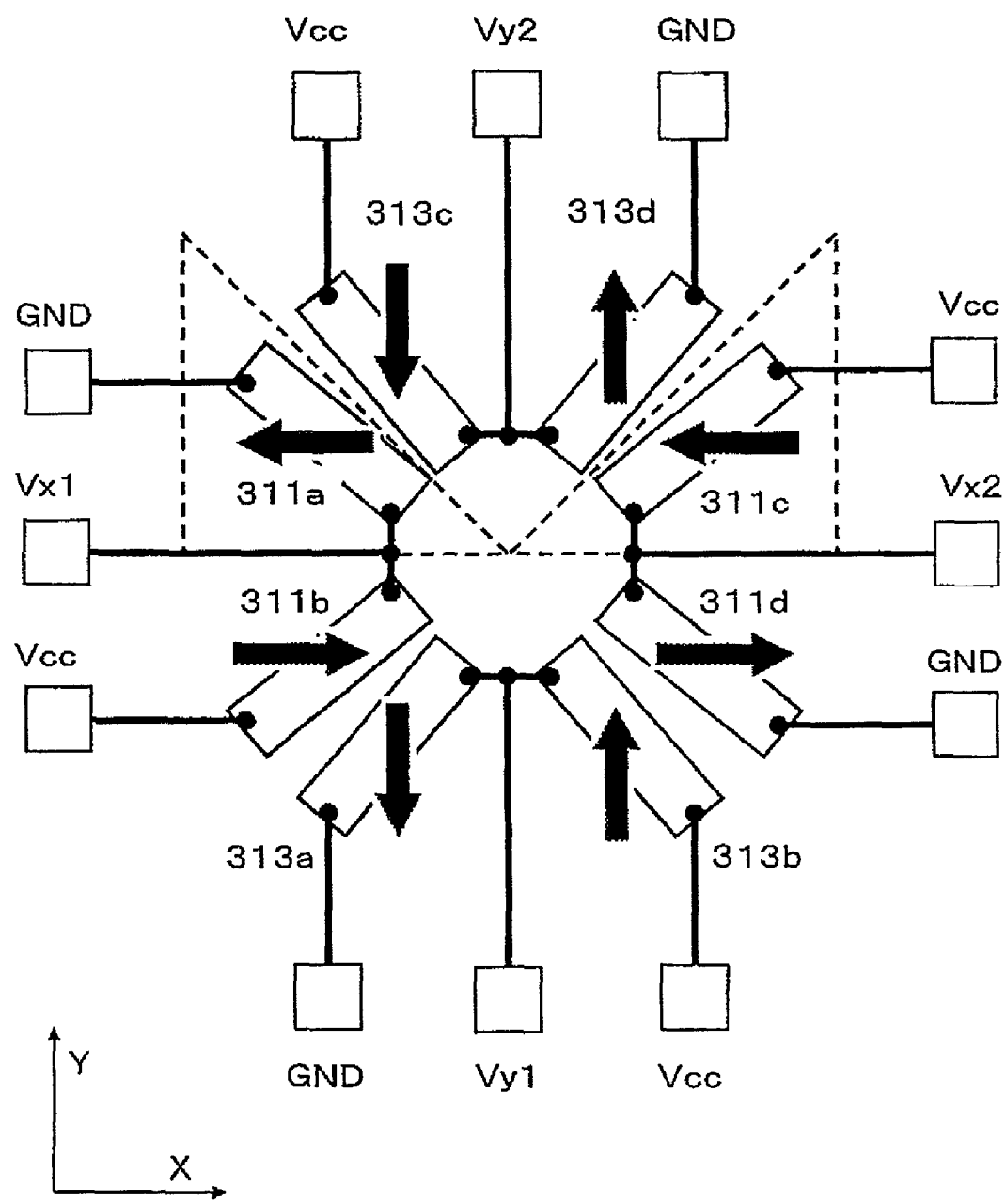
FIG. 31 is a schematic view showing a further example of bridge circuits comprising magnetoresistive devices.
Figure 32:
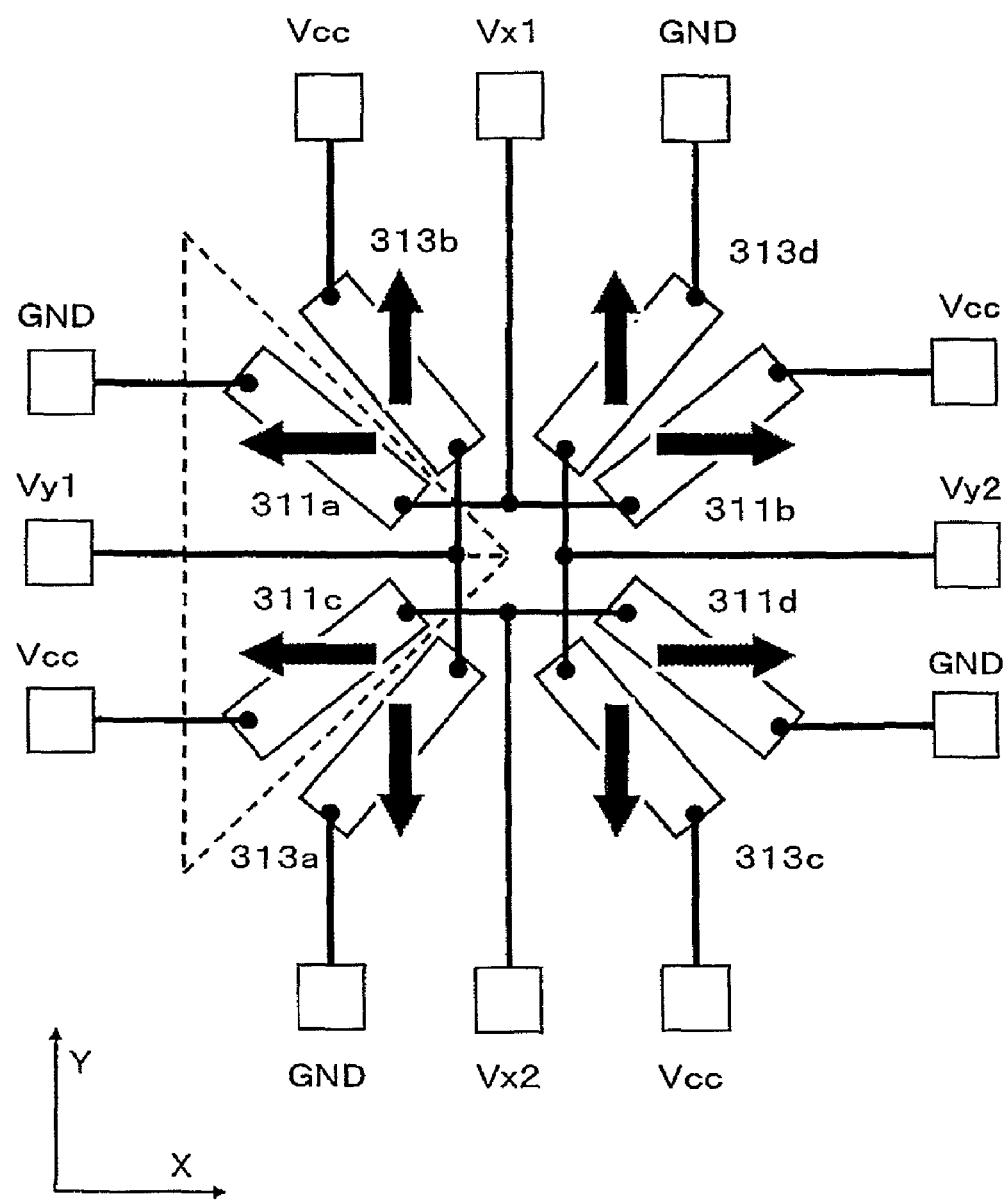
FIG. 32 is a schematic view showing a still further example of bridge circuits comprising magnetoresistive devices.

Because the devices 311c and 311b, and the devices 313a and 313d are respectively equivalent in FIG. 29, the interchange of the device 313a and the device 313d would not change the relation between the longitudinal direction of a device and the magnetization direction of a pinned layer as shown in FIG. 30. With insulating layers interposed in wire crossing portions, bridges are insulated. FIGS. 31 and 32 show other examples of the device arrangements. The examples shown in FIGS. 31 and 32 differ from that shown in FIG. 29 with respect to the angle between adjacent devices, though they are identical with respect to the relation between the longitudinal directions of devices and the magnetization directions of pinned layers.

Figure 33:
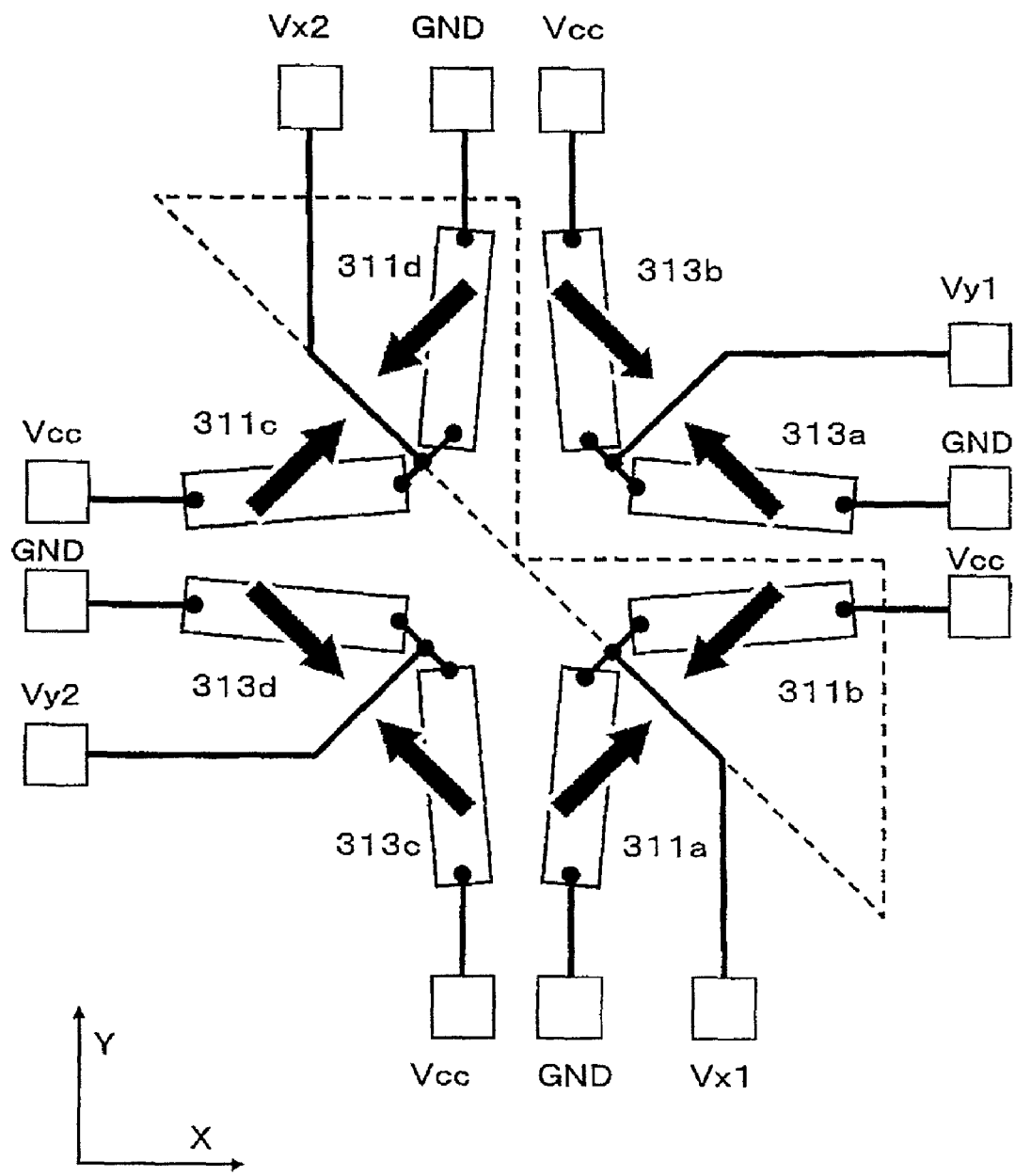
FIG. 33 is a schematic view showing a still further example of bridge circuits comprising magnetoresistive devices.
Figure 34:
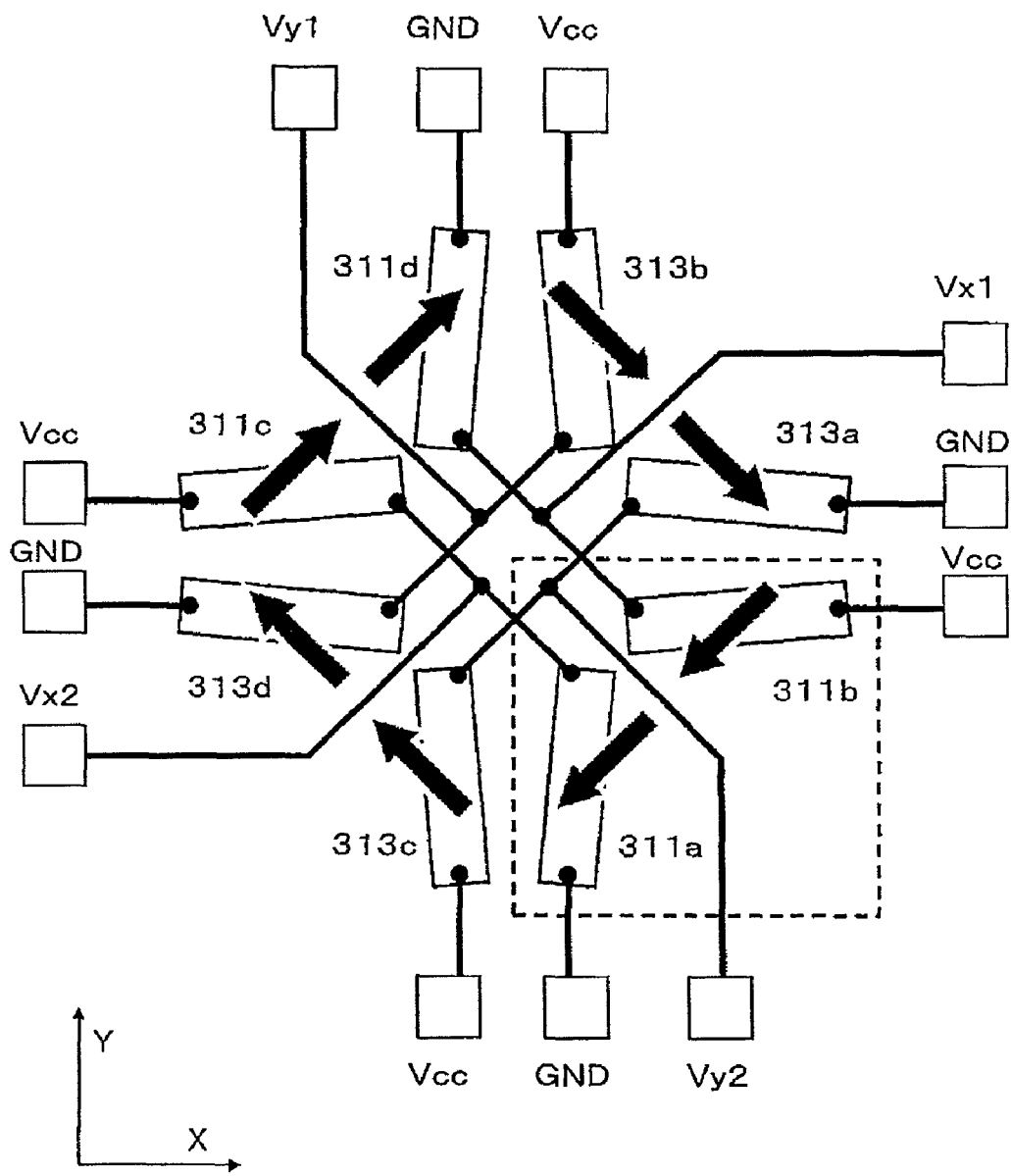
FIG. 34 is a schematic view showing a still further example of bridge circuits comprising magnetoresistive devices.
Figure 35:
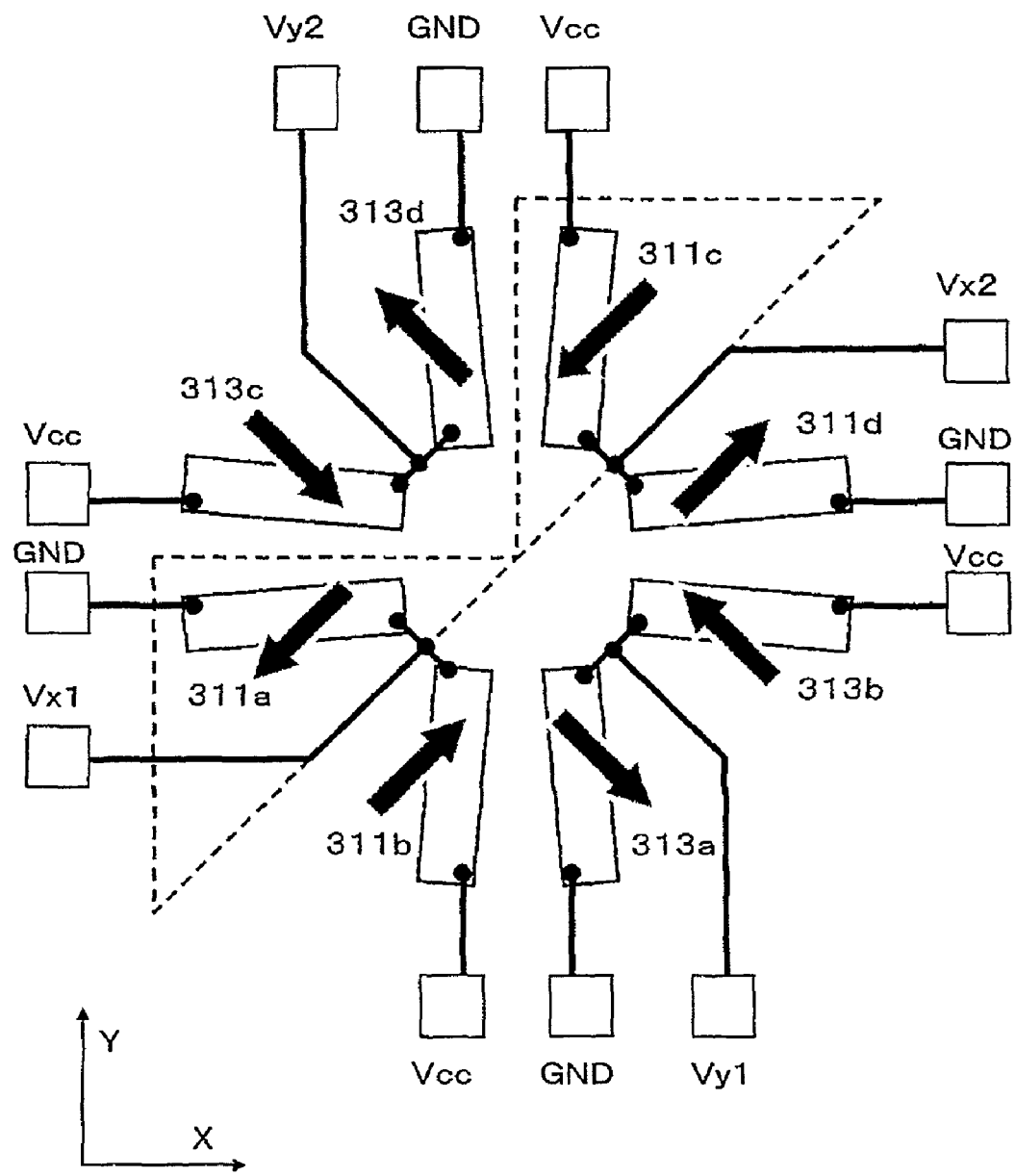
FIG. 35 is a schematic view showing a still further example of bridge circuits comprising magnetoresistive devices.
Figure 36:
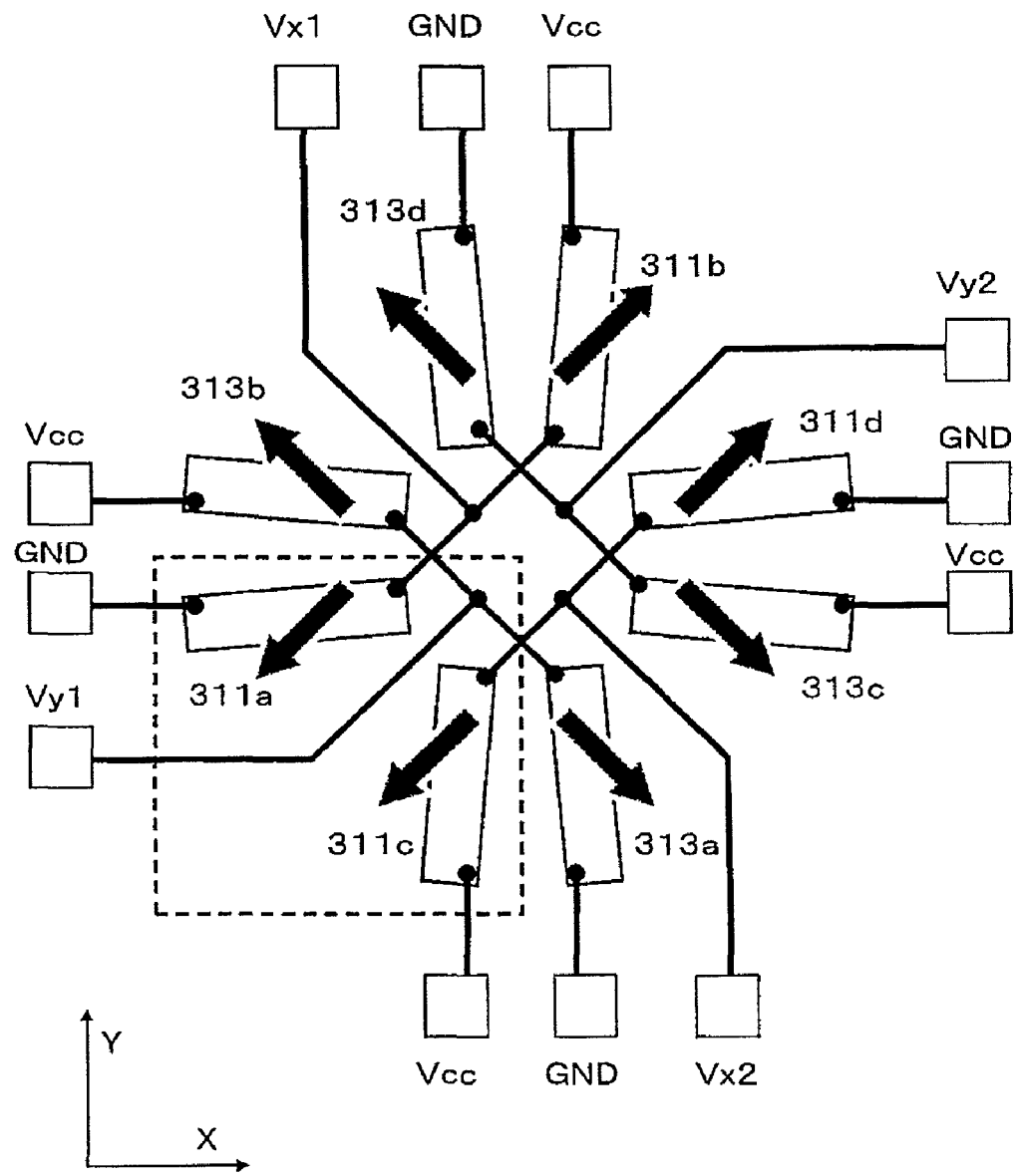
FIG. 36 is a schematic view showing a still further example of bridge circuits comprising magnetoresistive devices.

Such interchange of devices can be made possible by SVGMR films with the magnetization directions of pinned layers freely designed during formation. Further, the use of a film-forming apparatus, in which the direction of a magnetic field can be arbitrarily set during film formation, a higher degree of freedom in the device arrangement is obtained. FIG. 33 shows a bridge circuit in which the devices of FIG. 29 are rotated by 45° in a plane. The 45° rotation of each device from FIG. 29 provides a denser device arrangement. Namely, the optimization of the relation between the longitudinal directions of devices and the magnetization directions of pinned layers provides a magnetic sensor comprising freely arrangeable devices and having high resistance to the variation of SVGMR film characteristics, small output distortion, and small angle error, and a rotation-angle-detecting apparatus. In the structure shown in FIG. 33, part of the magnetization directions may be changed as shown in FIG. 34. FIGS. 35 and 36 show still further examples.

Figure 37:
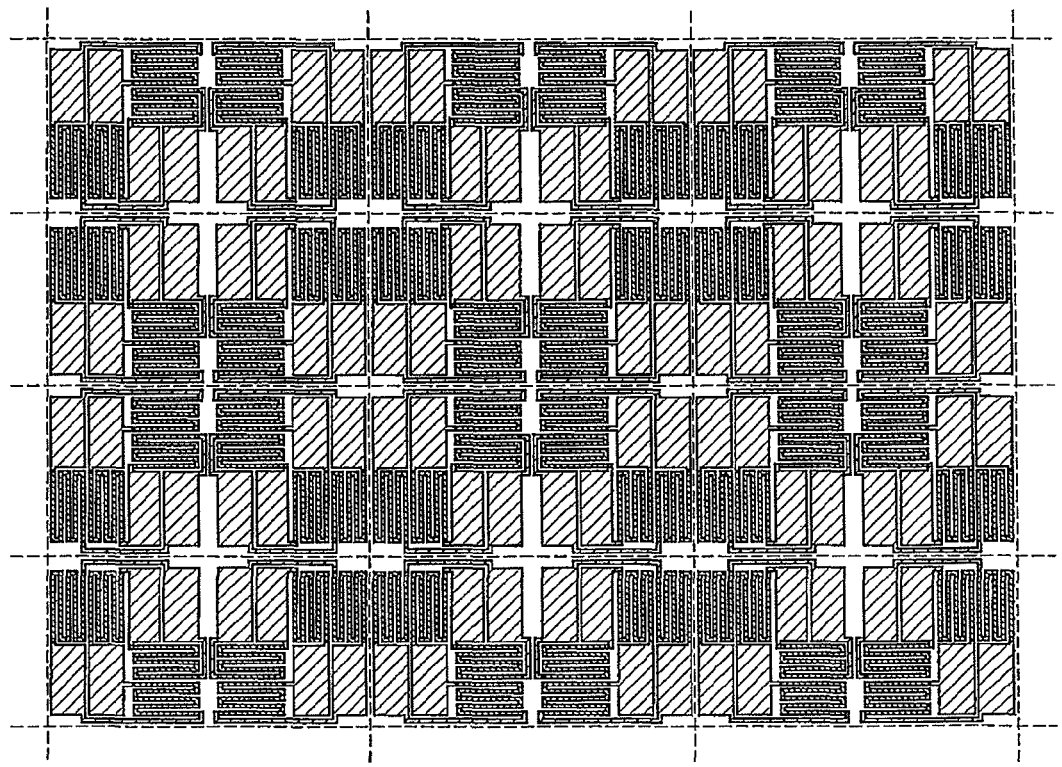
FIG. 37 is a schematic view showing the arrangement of magnetoresistive devices described in JP 2003-502876 A.
Figure 38:
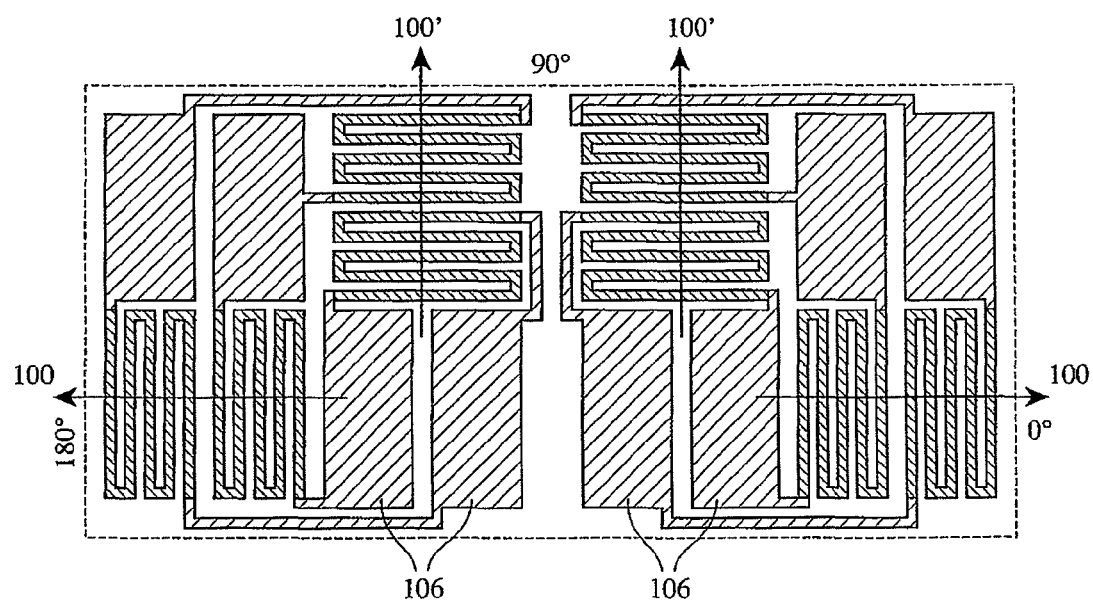
FIG. 38 is a view showing part of the arrangement of magnetoresistive devices shown in FIG. 37.

It is clear from the above that meeting the condition of $36°\leq\theta_{dip}<45°$ provides a magnetic sensor having much smaller angle error and output distortion than those of the device arrangement (FIGS. 37 and 38) described in JP 2003-502876 A, in which the angle between devices is 90° (corresponding to $\theta_{dip}=45°$).

Although the present invention has been explained in detail referring to the attached drawings, the present invention is not restricted thereto, and various modifications can be made within the scope of the present invention.

EFFECT OF THE INVENTION

The magnetic sensor and rotation-angle-detecting apparatus of the present invention suffer less angle error due to the production variation of SVGMR films, and less bridge output distortion.

What is claimed is:

1. A magnetic sensor comprising a bridge circuit in which four magnetoresistive devices are connected,
    said magnetoresistive device comprising a spin-valve, giant-magnetoresistive film comprising a pinned layer having unidirectional magnetic anisotropy, a free layer whose magnetization direction is rotated in alignment with an external magnetic field direction, and an intermediate layer sandwiched by said pinned layer and said free layer, and
    at least one of said magnetoresistive devices meeting the condition of $36°\leq\theta<45°$, wherein θ is an acute angle between its longitudinal direction and the magnetization direction of the pinned layer.

2. The magnetic sensor according to claim 1, wherein two magnetoresistive devices are inclined by said acute angle θ, with the remaining two magnetoresistive devices inclined by an acute angle −θ, from the magnetization direction of the pinned layer.

3. The magnetic sensor according to claim 1, which comprises another bridge circuit in addition to said bridge circuit, a longitudinal direction of a magnetoresistive device in one bridge circuit being perpendicular to a longitudinal direction of a corresponding magnetoresistive device in the other bridge circuit.

4. The magnetic sensor according to claim 1, wherein two magnetoresistive devices constituting each half-bridge comprise pinned layers having antiparallel magnetization directions, and wherein one device is inclined by an angle θ, with the other device inclined by an angle −θ, from said magnetization direction of the pinned layer in each half-bridge.

5. The magnetic sensor according to claim 1, wherein two magnetoresistive devices constituting each half-bridge comprise pinned layers having antiparallel magnetization directions, both magnetoresistive devices in one half-bridge are inclined by an angle θ, with both magnetoresistive devices in the other half-bridge inclined by an angle −θ, from the magnetization direction of the pinned layer.

6. The magnetic sensor according to claim 1, wherein said magnetoresistive device has (a) a shape of a folded straight line, (b) a shape comprising pluralities of semi-circles connected and longitudinally folded, (c) a shape comprising pluralities of partially notched circles connected and longitudinally folded, or (d) a shape comprising pluralities of partially notched polygons connected and longitudinally folded.

7. The magnetic sensor according to claim 1, wherein an exchange-coupling field $H_{int}$ between the pinned layer and the free layer in said spin-valve, giant-magnetoresistive film meets the condition of $-0.4 \text{ kA/m} \leq H_{int} \leq +0.4 \text{ kA/m}$.

8. A rotation-angle-detecting apparatus comprising the magnetic sensor recited in claim 1, and a magnet for applying a magnetic field to said magnetic sensor.

9. A magnetic sensor comprising a bridge X comprising first to fourth magnetoresistive devices and a bridge Y comprising fifth to eighth magnetoresistive devices, said magnetoresistive device comprising a spin-valve, giant-magnetoresistive film comprising a pinned layer having unidirectional magnetic anisotropy, a free layer whose magnetization direction is rotated in alignment with an external magnetic field direction, and an intermediate layer sandwiched by said pinned layer and said free layer, an angle between the longitudinal direction of each device and the magnetization direction of the pinned layer meeting the following conditions:

the angle of the first device=the angle of the third device, the angle of the second device=the angle of the fourth device, the angle of the first device=−the angle of the second device, the angle of the fifth device=the angle of the seventh device, the angle of the sixth device=the angle of the eighth device, the angle of the fifth device=−the angle of the sixth device, and at least one of said magnetoresistive devices meeting the condition of $37° \leq \theta \leq 44°$, wherein θ is an acute angle between its longitudinal direction and the magnetization direction of the pinned layer.

10. The magnetic sensor according to claim 9, wherein the longitudinal direction of each device in said bridge X is perpendicular to the longitudinal direction of a corresponding device in said bridge Y.

11. A rotation-angle-detecting apparatus comprising the magnetic sensor recited in claim 9, and a magnet for applying a magnetic field to said magnetic sensor.

12. A magnetic sensor comprising a bridge X comprising first to fourth magnetoresistive devices and a bridge Y comprising fifth to eighth magnetoresistive devices, said magnetoresistive device comprising a spin-valve, giant-magnetoresistive film comprising a pinned layer having unidirectional magnetic anisotropy, a free layer whose magnetization direction is rotated in alignment with an external magnetic field direction, and an intermediate layer sandwiched by said pinned layer and said free layer, an angle between the longitudinal direction of each device and the magnetization direction of the pinned layer meeting the following conditions:

the angle of the first device=the angle of the fourth device, the angle of the second device=the angle of the third device, the angle of the first device=−the angle of the second device, the angle of the fifth device=the angle of the eighth device, the angle of the sixth device=the angle of the seventh device, the angle of the fifth device=−the angle of the sixth device, and at least one of said magnetoresistive devices meeting the condition of $39° \leq \theta \leq 44°$, wherein θ is an acute angle between its longitudinal direction and the magnetization direction of the pinned layer.

13. The magnetic sensor according to claim 12, wherein the longitudinal direction of each device in said bridge X is perpendicular to the longitudinal direction of a corresponding device in said bridge Y.

14. A rotation-angle-detecting apparatus comprising the magnetic sensor recited in claim 12, and a magnet for applying a magnetic field to said magnetic sensor.

* * * * *